(12) United States Patent
Kwon et al.

(10) Patent No.: US 12,507,794 B2
(45) Date of Patent: Dec. 30, 2025

(54) WAFER CLEANING APPARATUS

(71) Applicant: Samsung Electronics Co., Ltd., Suwon-si (KR)

(72) Inventors: Donghoon Kwon, Suwon-si (KR); Jaemin Jung, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 190 days.

(21) Appl. No.: 18/438,750

(22) Filed: Feb. 12, 2024

(65) Prior Publication Data
US 2025/0040693 A1   Feb. 6, 2025

(30) Foreign Application Priority Data
Aug. 1, 2023   (KR) .................. 10-2023-0100638

(51) Int. Cl.
| | |
|---|---|
| *H01L 21/67* | (2006.01) |
| *A46B 13/00* | (2006.01) |
| *A46B 17/06* | (2006.01) |
| *B08B 1/52* | (2024.01) |
| *B08B 3/12* | (2006.01) |

(52) U.S. Cl.
CPC ............ *A46B 17/06* (2013.01); *A46B 13/001* (2013.01); *B08B 1/52* (2024.01); *B08B 3/123* (2013.01); *H01L 21/67046* (2013.01); *H01L 21/67051* (2013.01); *A46B 2200/3073* (2013.01); *B08B 2203/007* (2013.01)

(58) Field of Classification Search
CPC .............. A46B 17/06; A46B 13/001; A46B 2200/3073; B08B 1/52; B08B 3/123; B08B 2203/007; H01L 21/67046; H01L 21/67051

USPC ............................................. 134/104.1
See application file for complete search history.

(56) References Cited

U.S. PATENT DOCUMENTS

| | | | |
|---|---|---|---|
| 6,615,433 B2 | 9/2003 | Crevasse et al. | |
| 8,458,843 B2 | 6/2013 | Ko et al. | |
| 8,608,858 B2 | 12/2013 | Hamada | |
| 9,610,615 B2 | 4/2017 | Tien et al. | |
| 11,382,412 B2 | 7/2022 | Park et al. | |

(Continued)

FOREIGN PATENT DOCUMENTS

| | | |
|---|---|---|
| JP | 7137941 B2 | 9/2022 |
| KR | 2001-0003342 A | 1/2001 |

*Primary Examiner* — Tinsae B Ayalew
(74) *Attorney, Agent, or Firm* — Muir Patent Law, PLLC

(57) ABSTRACT

A wafer cleaning apparatus includes a wafer roller rotating a wafer around a first direction parallel to a normal direction of a first surface of the wafer, a first brush facing the first surface of the wafer, a second brush facing a second surface of the wafer opposite to the first surface, a first cleaning tank disposed apart from the first brush and movable to accommodate at least a portion of the first brush, and a second cleaning tank disposed apart from the second brush and movable to accommodate at least a portion of the second brush. The first and second cleaning tanks include a first solution injection member connected to a first solution supply pipe and a second solution injection member connected to a second solution supply pipe, respectively. Each of the first and second solution injection members includes a bubble generating filter having a plurality of through-holes.

20 Claims, 29 Drawing Sheets

(56) References Cited

U.S. PATENT DOCUMENTS

2019/0006204 A1* 1/2019 Wei ................. B24B 37/044
2021/0039142 A1* 2/2021 Takatoh ............... B08B 1/14

* cited by examiner

WAFER CLEANING APPARATUS

CROSS-REFERENCE TO RELATED APPLICATION

This application claims priority to and the benefit of Korean Patent Application No. 10-2023-0100638 filed on Aug. 1, 2023 in the Korean Intellectual Property Office, the entire contents of which is herein incorporated by reference.

BACKGROUND

1. Field

The present disclosure relates to a wafer cleaning apparatus.

2. Description of the Related Art

In a manufacturing process of a semiconductor device, a chemical mechanical polishing (CMP) process is widely used as a planarization technique for removing a step between films formed on a substrate.

The chemical mechanical polishing process may efficiently planarize films formed on a substrate by injecting a slurry composition containing polishing particles between the substrate and a polishing pad and causing friction between the substrate and the polishing pad.

Equipment used in this CMP process includes a polishing apparatus for polishing and a wafer cleaning apparatus for cleaning. The wafer cleaning apparatus is used for the purpose of removing slurry residue and other particles from polished wafers.

In the process of cleaning the wafer, it is important to clean the brush such that no residue is left on the surface of the brush to prevent residues on the surface of the brush cleaning the wafer from contaminating the cleaned wafer.

SUMMARY

The present disclosure attempts to provide a wafer cleaning apparatus capable of efficiently cleaning a brush for cleaning a wafer surface.

According to an aspect of the present disclosure, a wafer cleaning apparatus includes a wafer roller configured to rotate a wafer around a first direction, wherein the wafer includes a first surface and a second surface that is an opposite surface of the first surface, and the first direction is parallel to a normal direction of the first surface of the wafer, a first brush facing the first surface of the wafer, a second brush facing the second surface of the wafer, wherein the second brush is spaced apart from the first brush in the first direction, and the first and second surfaces of the wafer is disposed in a space between the first and second brushes, a first cleaning tank disposed apart from the first brush and movable to accommodate at least a portion of the first brush, and a second cleaning tank disposed apart from the second brush and movable to accommodate at least a portion of the second brush. The first cleaning tank and the second cleaning tank include a first solution injection member connected to a first solution supply pipe and a second solution injection member connected to a second solution supply pipe, respectively. Each of the first and second solution injection members includes a bubble generating filter having a plurality of through-holes.

According to an aspect of the present disclosure, a wafer cleaning apparatus includes a wafer roller configured to rotate a wafer around a first direction, wherein the wafer includes a first surface and a second surface that is an opposite surface of the first surface, and the first direction is parallel to a normal direction of the first surface of the wafer, a first brush and a second brush disposed side by side in a horizontal direction with respect to a floor on which the wafer cleaning apparatus is installed, wherein the horizontal direction is parallel to the first direction, wherein the first surface and the second surface of the wafer are disposed between the first and second brushes, and wherein the first and second surfaces of the wafer face the first and second brushes, respectively, a first cleaning tank disposed below the first brush, and movable to accommodate at least a portion of the first brush, and a second cleaning tank disposed below the second brush, and movable to accommodate at least a portion of the second brush. Each of the first cleaning tank and the second cleaning tank includes a first side surface and a second side surface extending in a same direction as an extension direction of each of the first cleaning tank and the second cleaning tank, a third side surface and a fourth side surface crossing each of the first side surface and the second side surface, at least one solution injection member disposed on at least one of the first side surface, the second side surface, the third side surface, and the fourth side surface, wherein each of the at least one solution injection member includes a bubble generating filter having a plurality of through-holes, a first main heating member contacting the first side surface, and a second main heating member contacting the second side surface.

According to an embodiment of the present disclosure, a wafer cleaning apparatus includes a wafer roller configured to rotate a wafer around a first direction, wherein the wafer includes a first surface and a second surface that is an opposite surface of the first surface, and the first direction is parallel to a normal direction of the first surface of the wafer, a first brush facing the first surface of the wafer, a second brush facing the second surface of the wafer, and disposed under the first brush in a vertical direction with respect to a floor on which the wafer cleaning apparatus is installed, wherein the vertical direction is parallel to the first direction, a first cleaning tank disposed below the second brush in the vertical direction, and accommodating at least a portion of the second brush, and a second cleaning tank disposed side by side to the first cleaning tank in a horizontal direction with respect to the floor, and movable to accommodate at least a portion of the first brush. Each of the first cleaning tank and the second cleaning tank includes a main heating member disposed on a first side surface of the first cleaning tank and a first side surface of the second cleaning tank, and a solution injection member disposed on a second side surface of the first cleaning tank and a second side surface of the second cleaning tank. The solution injection member includes a bubble generating filter having a plurality of through-holes, a first sub-heating member surrounding a side surface of the bubble generating filter, and a second sub-heating member extending from a central portion of the bubble generating filter toward the side surface of the bubble generating filter.

According to embodiments, a wafer cleaning apparatus may include a cleaning tank that accommodates at least a portion of a brush to remove contaminants on the brush, and thus the contaminants on the brush may be effectively removed.

DETAILED DESCRIPTION

Figure 1:
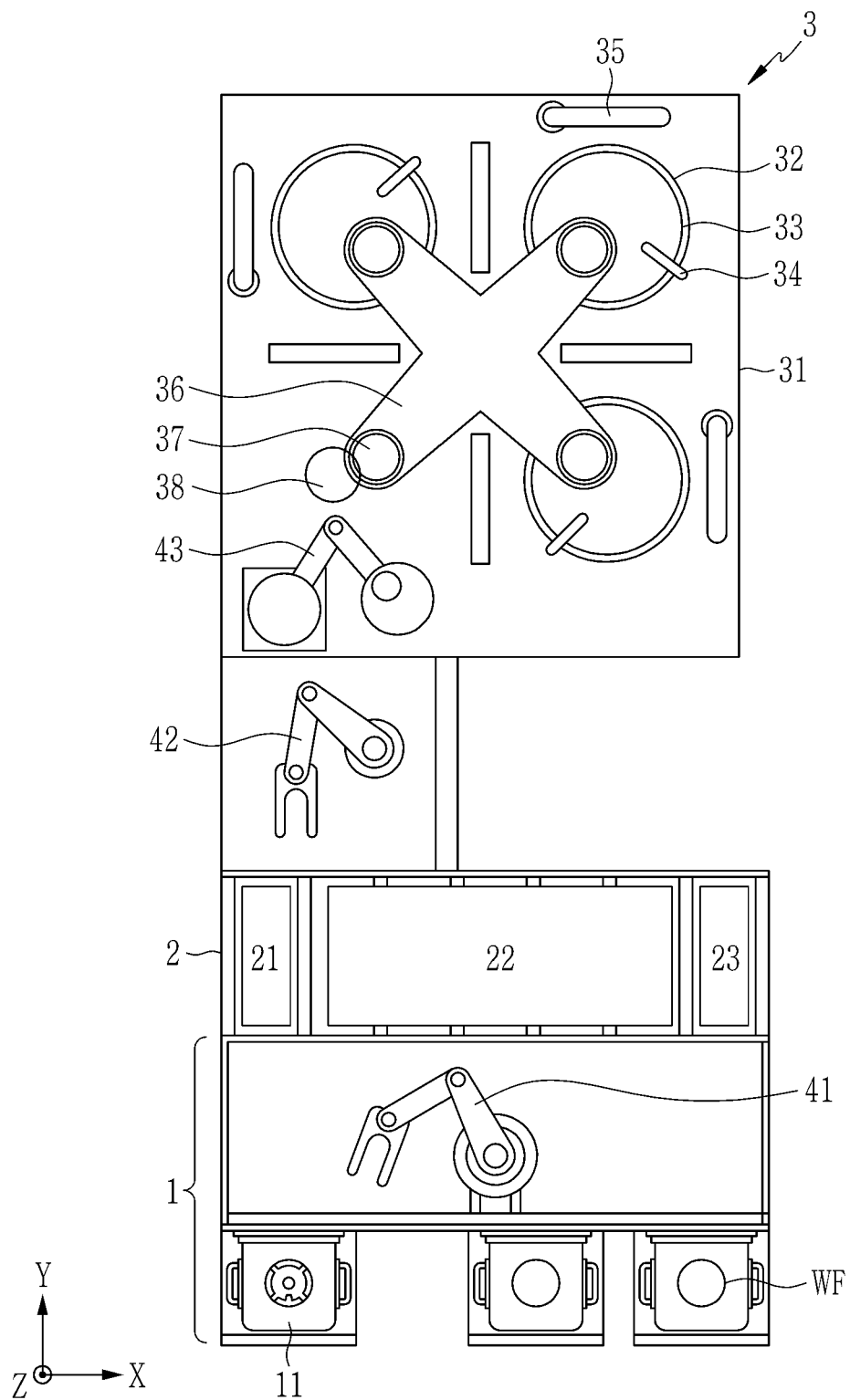
FIG. 1 is a schematic top plan view for explaining a polishing facility including a wafer cleaning apparatus according to an embodiment.

Hereinafter, embodiments of the disclosure will be hereinafter described in detail with reference to the accompanying drawings, such that those skilled in the art may easily implement time. The disclosure may be implemented in various forms, and may not be limited to embodiments as described herein.

The drawings and description are to be regarded as illustrative in nature and not restrictive. Like reference numerals designate like elements throughout the specification.

Further, in the drawings, the size and thickness of each element are arbitrarily illustrated for ease of description, and the present disclosure is not necessarily limited to those illustrated in the drawings. In the drawings, the thickness of layers, films, panels, regions, etc., are exaggerated for clarity. In the drawings, for ease of description, the thicknesses of some layers and areas are exaggerated.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

FIG. 1 is a schematic top plan view for explaining a polishing facility including a wafer cleaning apparatus according to an embodiment.

Referring to FIG. 1, a polishing facility according to an embodiment may include an index portion 1 (i.e., an index unit), a cleaning apparatus 2 (i.e., a wafer cleaning apparatus), and a chemical mechanical polishing apparatus 3.

The index portion 1 may include a cassette 11 and a first transfer robot 41.

A wafer WF before or after a chemical mechanical polishing process (hereinafter referred to as the CMP process) may be stored in the cassette 11.

The first transfer robot 41 may move the wafer WF before the CMP process from the cassette 11 to the cleaning apparatus 2. In addition, the first transfer robot 41 may move the cleaned wafer WF from the cleaning apparatus 2 to the cassette 11.

The cleaning apparatus 2 may be disposed between the index portion 1 and a second transfer robot 42.

The cleaning apparatus 2 may include an input module 21, a wafer cleaning apparatus 22, and an output module 23.

The wafer WF stored in the input module 21 may be moved to the output module 23 via the wafer cleaning apparatus 22. For example, after the CMP process is completed, the first transfer robot 41 may move the wafer WF from the input module 21 to the wafer cleaning apparatus 22.

The first transfer robot 41 may move the wafer WF within the wafer cleaning apparatus 22 or move the wafer WF from the wafer cleaning apparatus 22 to the output module 23.

The input module 21 may store the wafer WF before being input to the chemical mechanical polishing apparatus 3. The input module 21 may store the wafer WF received from the chemical mechanical polishing apparatus 3 before being input to the wafer cleaning apparatus 22. The output module 23 may receive the cleaned wafer WF from the wafer cleaning apparatus 22 and store the cleaned wafer WF.

The wafer cleaning apparatus 22 may remove residues or particles that may remain on the wafer WF after the CMP process using chemical and physical methods. A detailed description with respect to the wafer cleaning apparatus 22 will be later provided with reference to FIG. 2 and below.

In FIG. 1, the cleaning apparatus 2 is illustrated as including the input module 21, the wafer cleaning apparatus 22, and the output module 23, but is not limited thereto and may further include other devices. For example, the cleaning apparatus 2 may further include a megasonic device and a wafer drying device, and the wafer WF stored in the input module 21 may move to the output module 23 via the megasonic equipment, the wafer cleaning apparatus 22, and a wafer drying device.

The chemical mechanical polishing apparatus 3 may polish the wafer WF. The chemical mechanical polishing apparatus 3 may include a lower base 31, a polishing platen 32, a polishing pad 33, a slurry supplier 34, a pad conditioner 35, an upper base 36, a polishing head 37, and a load cup 38.

The lower base 31 may provide a lower structure of the chemical mechanical polishing apparatus 3 according to an embodiment. For example, the lower base 31 may support the polishing platen 32, the polishing pad 33, the slurry supplier 34, the pad conditioner 35, the upper base 36, the polishing head 37, and the load cup 38.

The polishing platen 32 may be disposed above an upper surface of the lower base 31. The polishing platen 32 may be rotatable.

The polishing pad 33 may be disposed above an upper surface of the polishing platen 32. The polishing pad 33 may be rotatably supported by the polishing platen 32. The polishing pad 33 may be provided as a circular plate, but is not limited thereto and may be provided as a plate of various shapes.

The polishing pad 33 may include a polishing surface having a predetermined roughness. While the chemical mechanical polishing process is being performed, the polishing surface of the polishing pad 33 may contact the wafer WF to mechanically polish the wafer WF. The term "contact," as used herein, refers to a direct connection (i.e., physical touching) unless the context indicates otherwise.

The polishing pad 33 may include or may be formed of a porous material having a plurality of microspaces (i.e., pores). Microspaces of the polishing pad 33 may accommodate the slurry provided for polishing while the chemical mechanical polishing process is performed. The polishing pad 33 may include or may be, for example, a polyurethane pad, but is not limited thereto.

The slurry supplier 34 may be adjacent to the polishing pad 33. While the chemical mechanical polishing process is being performed, the slurry supplier 34 may supply slurry on the polishing pad 33.

The pad conditioner 35 may be adjacent to the polishing pad 33. The pad conditioner 35 may perform a conditioning process (i.e., a maintenance process) on the polishing pad 33. Accordingly, the pad conditioner 35 may stably maintain the state of the polishing surface of the polishing pad 33 such that the wafer WF is effectively polished during the chemical mechanical polishing process.

The upper base 36 and the polishing head 37 may be disposed above the lower base 31.

The polishing head 37 may provide the wafer WF on the polishing pad 33. A polishing head 37 may be positioned above each polishing platen 32 by means of an upper base 36. For example, after loading the wafer WF in the load cup 38, the polishing head 37 may be moved to the polishing platen 32 to polish the wafer WF. The polishing head 37 may unload the polished wafer WF to the load cup 38.

The second transfer robot 42 may be disposed between the chemical mechanical polishing apparatus 3 and the index portion 1. The second transfer robot 42 may transfer the wafer WF between the chemical mechanical polishing apparatus 3 and the index portion 1.

An exchanger 43 may be disposed between the second transfer robot 42 and the load cup 38. The exchanger 43 may transfer the wafer WF transferred from the index portion 1 by the second transfer robot 42 to the load cup 38, or may transfer the wafer WF disposed on the load cup 38 to the second transfer robot 42.

The wafer WF polished in the chemical mechanical polishing apparatus 3 may be disposed on the load cup 38. The wafer WF disposed on the load cup 38 may be transferred to the cleaning apparatus 2 by the second transfer robot 42 that is adjacent to the load cup 38. The cleaning apparatus 2 may clean contaminants remaining on the polished wafer WF. The cleaned wafer WF is transferred to the output module 23. Subsequently, the wafer WF may be transferred to the index unit 1 and stored in the cassette 11. Accordingly, the polishing process of the wafer WF may be completed.

Hereinafter, the wafer cleaning apparatus 22 according to an embodiment will be described with reference to FIG. 2 to FIG. 8B.

Figure 2:
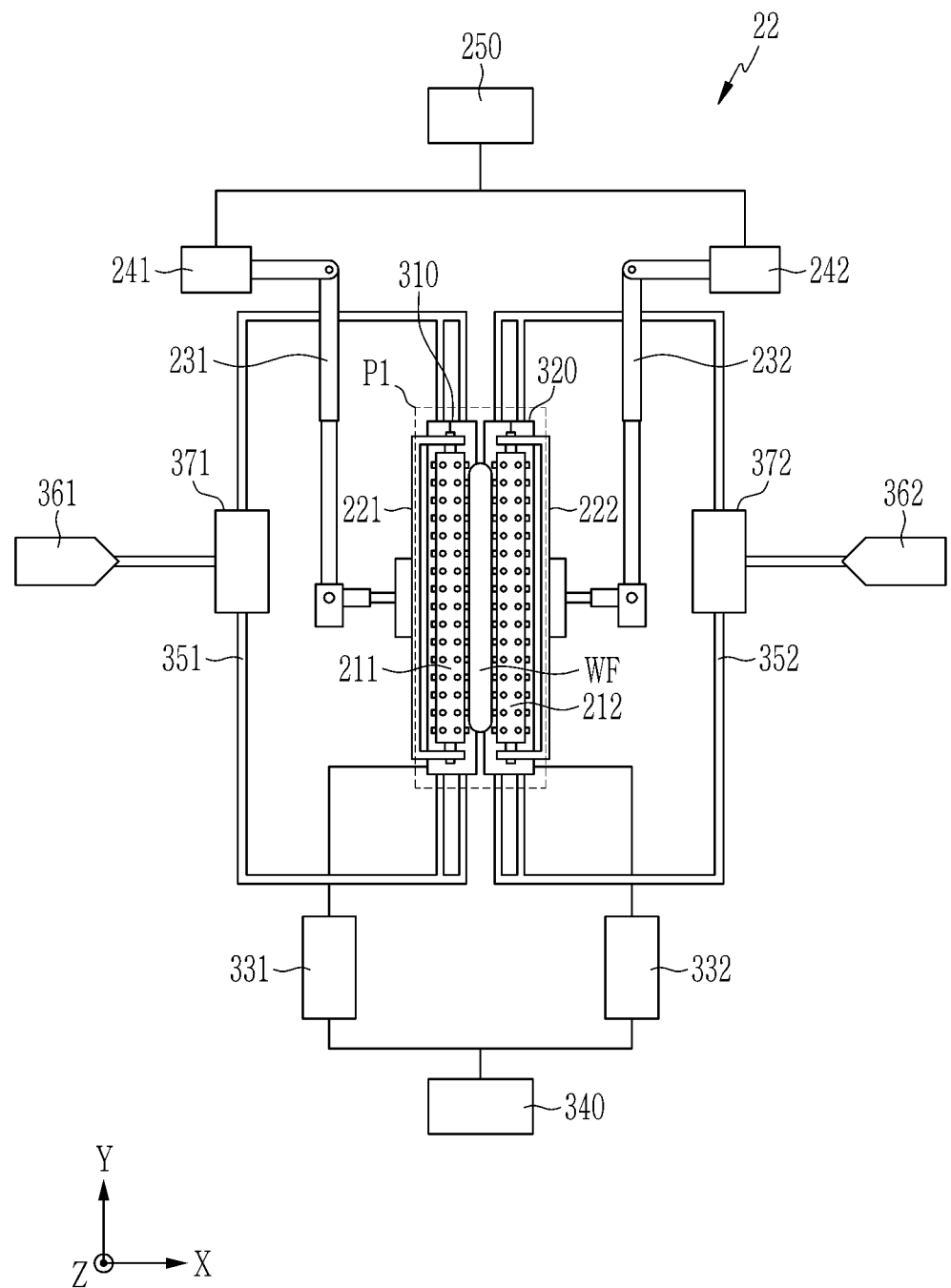
FIG. 2 is a top plan view schematically showing a configuration of a wafer cleaning apparatus according to an embodiment.
Figure 3:
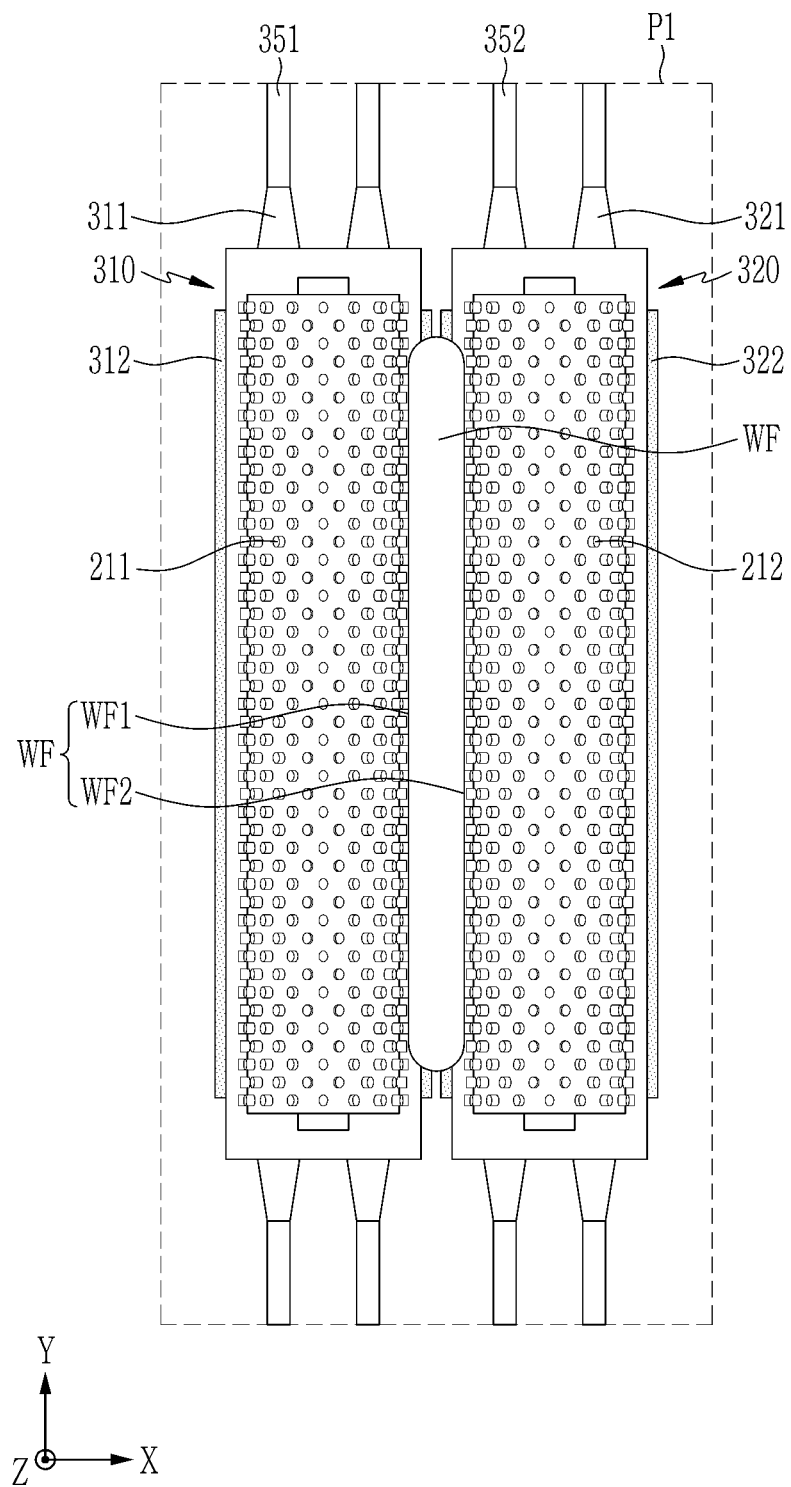
FIG. 3 is a partial enlarged view of a region P1 of FIG. 2.
Figure 4:
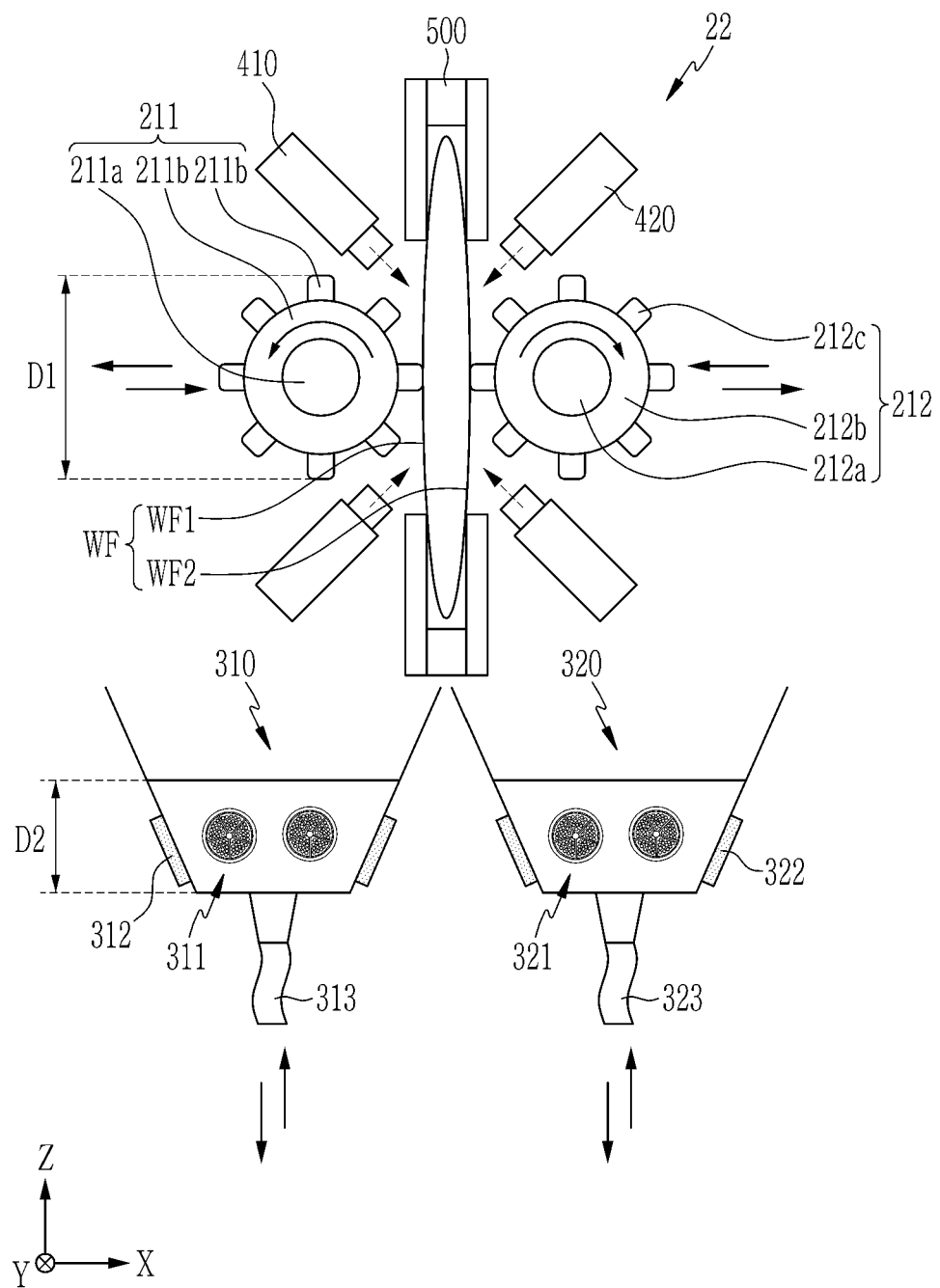
FIG. 4 is a front view schematically showing a wafer cleaning apparatus according to an embodiment.
Figure 5:
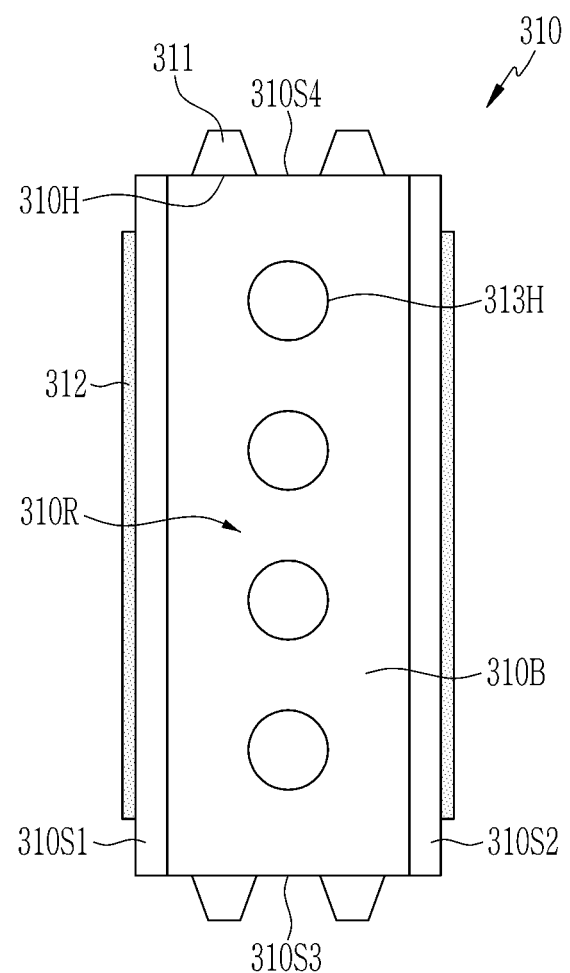
FIG. 5 is a top plan view schematically showing a cleaning tank of a wafer cleaning apparatus according to an embodiment.
Figure 6:
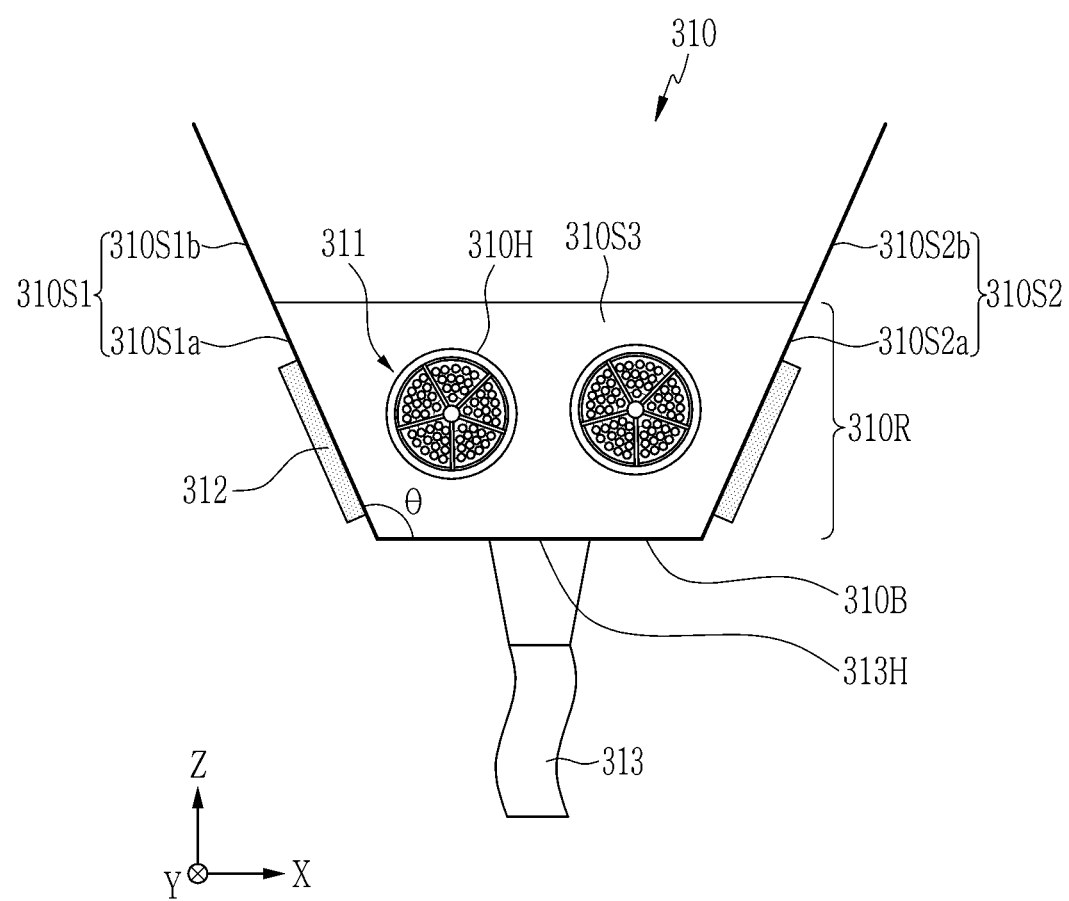
FIG. 6 is a front view schematically showing a cleaning tank of a wafer cleaning apparatus according to an embodiment.
Figure 7:
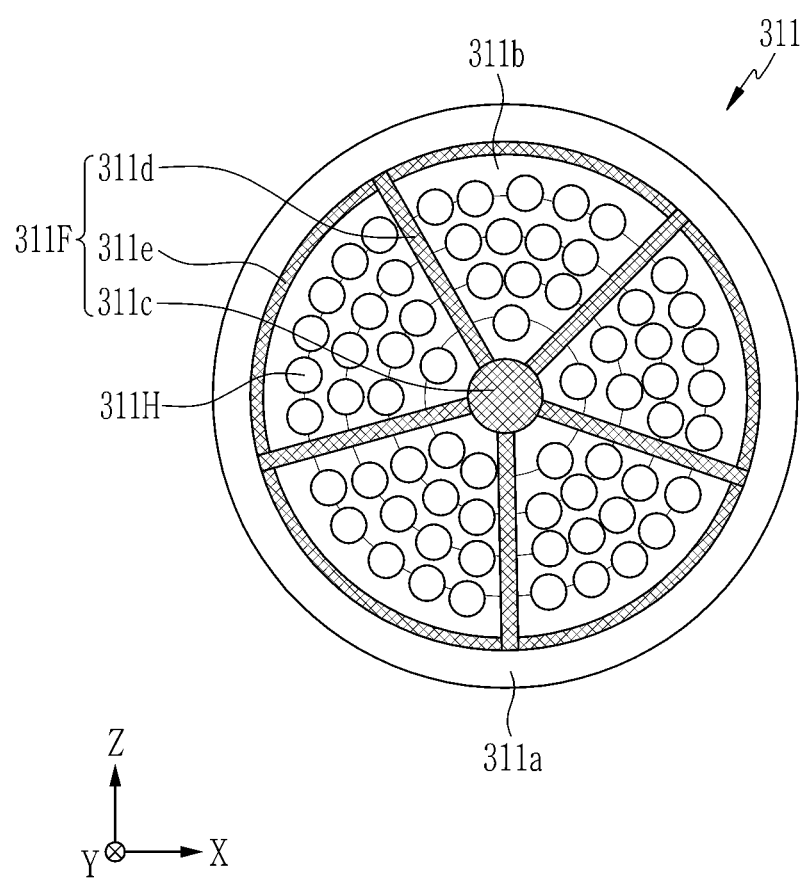
FIG. 7 is a front view schematically showing a solution supply member of a wafer cleaning apparatus according to an embodiment.
Figure 8A:
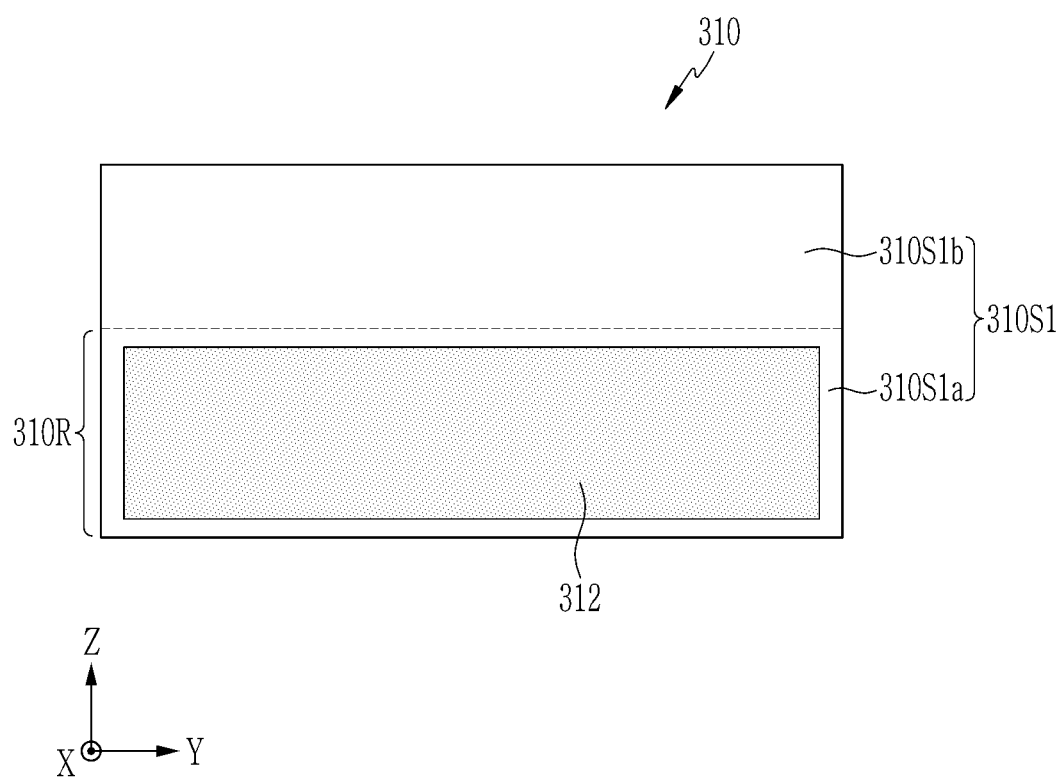
FIG. 8A and FIG. 8B are side views of a cleaning tank of a wafer cleaning apparatus according to some embodiments.
Figure 8B:
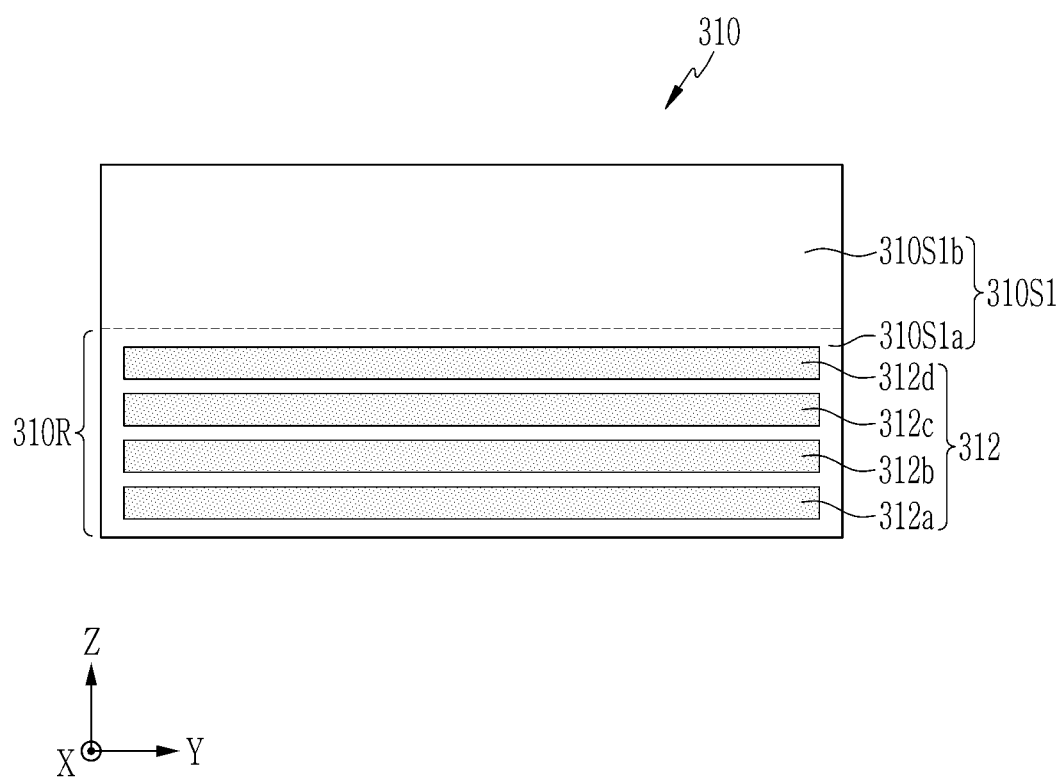

FIG. 2 is a top plan view schematically showing a configuration of a wafer cleaning apparatus according to an embodiment. FIG. 3 is a partial enlarged view of a region P1 of FIG. 2. FIG. 4 is a front view schematically showing a wafer cleaning apparatus according to an embodiment. FIG. 5 is a top plan view schematically showing a cleaning tank of a wafer cleaning apparatus according to an embodiment. FIG. 6 is a front view schematically showing a cleaning tank of a wafer cleaning apparatus according to an embodiment. FIG. 7 is a front view schematically showing a solution supply member of a wafer cleaning apparatus according to an embodiment. FIG. 8A and FIG. 8B are side views of a cleaning tank of a wafer cleaning apparatus according to some embodiments.

Referring to FIG. 2 to FIG. 4, the wafer cleaning apparatus 22 according to an embodiment may include a first brush 211, a second brush 212, a first cleaning tank 310, a second cleaning tank 320, a first solution supply pipe 351, a second solution supply pipe 352, a first solution supply member 361, a second solution supply member 362, and a wafer roller 500.

The first brush 211 and the second brush 212 may be disposed to face each other interposing the wafer WF for performing the cleaning process. For example, the first brush 211 and the second brush 212 are disposed side by side in a first direction X interposing the wafer WF, and may extend in a second direction Y crossing the first direction X.

For example, the first brush 211 may face a first surface WF1 positioned on a first side of the wafer WF in the first direction X, and the second brush 212 may face a second surface WF2 which is an opposite surface of the first surface WF1, positioned on a second side in the first direction X. When the wafer WF is rotated around the first direction X, which is parallel to a normal direction of the first surface WF1 of the wafer WF, the first and second brushes 211 and 212 may be arranged along the first direction X. The first and second surfaces WF1 and WF2 of the wafer WF may be disposed in a space between the first and second brushes 211 and 212.

Each of the first brush 211 and the second brush 212 may have a length greater than a diameter of the wafer WF. Here, the diameter of the wafer WF and the length of each of the first brush 211 and the second brush 212 may mean a diameter and a length along the second direction Y, respectively. For example, the diameter of the wafer WF and the length of each of the first brush 211 and the second brush 212 may be measured along the second direction Y.

Each of the first brush 211 and the second brush 212 may have a cylindrical shape. However, shapes of the first brush 211 and the second brush 212 are not limited thereto, and may be variously changed.

Each of the first brush 211 and the second brush 212 may include first and second brush rotation shafts 211a and 212a, first and second brush members 211b and 212b, and protrusions 211c and 212c.

Each of the first and second brush rotation shafts 211a and 212a may extend in the same direction as the first and second brushes 211 and 212. For example, the first and second brush rotation shafts 211a and 212a may extend in the second direction Y, and may be disposed parallel to the first surface WF1 and the second surface WF2 each of the wafer WF.

In an embodiment, the wafer cleaning apparatus 22 may further include first and second brush holders 221 and 222 coupled to the first and second brush rotation shafts 211a and 212a, respectively. The first and second brush rotation shafts 211a and 212a may be configured to rotate the first brush 211 and the second brush 212, respectively.

For example, the first and second brush rotation shafts 211a and 212a may be coupled to the first and second brush holders 221 and 222 to rotate the first brush 211 and the second brush 212, respectively. In an embodiment, the first brush 211 and the second brush 212 may rotate in different directions, and may simultaneously clean the first surface WF1 and the second surface WF2 of the wafer WF, respectively. For example, the first brush 211 may rotate counterclockwise, and the second brush 212 may rotate clockwise.

The first and second brush members 211b and 212b may surround the first and second brush rotation shafts 211a and 212a, and a plurality of protrusions 211c and 212c may be disposed in a regular arrangement on the surfaces of the first and second brush members 211b and 212b.

As the plurality of protrusions 211c and 212c are disposed on the surfaces of the first and second brush members 211b and 212b, contaminants such as slurry, abrasive residues, and the like positioned on each of the first surface WF1 of the wafer WF and the second surface WF2 may be effectively removed.

The first and second brush members 211b and 212b and the protrusions 211c and 212c may be formed of a porous sponge or resin material capable of holding moisture. For example, the first and second brush members 211b and 212b and the protrusions 211c and 212c may include or may be formed of a polymer such as polyvinyl alcohol (PVA).

The wafer cleaning apparatus 22 according to an embodiment may further include first and second brush moving members 231 and 232 configured to move each of the first brush 211 and the second brush 212 in the first direction X that is a horizontal direction with respect to a floor on which the wafer cleaning apparatus 22 is installed and in a third direction Z that is a vertical direction with respect to the floor on which the wafer cleaning apparatus 22 is installed. For example, the first and second brush moving members 231 and 232 may be a robot arm.

The wafer cleaning apparatus 22 may include first and second brush driving members 241 and 242 configured to transfer driving force to the first and second brush moving members 231 and 232.

The first brush driving member 241 may apply the driving force to a first brush moving member 231 such that the first brush 211 may move in the first direction X and the third direction Z, and the second brush driving member 242 may apply the driving force to the second brush moving member 232 such that the second brush 212 may move in the first direction X and the third direction Z.

The wafer cleaning apparatus 22 according to an embodiment may further include a brush controller 250 configured to move the first brush 211 and the second brush 212 in the first direction X or the third direction Z after cleaning the first surface WF1 and the second surface WF2 of the wafer WF.

For example, after cleaning the wafer WF by the brush controller 250, the first brush 211 and the second brush 212 may be moved in the first direction X away from the wafer WF, and the first and second brushes 211 and 212 may overlap the first cleaning tank 310 and the second cleaning tank 320 in the third direction Z and may be accommodated in the first cleaning tank 310 and the second cleaning tank 320, respectively. However, the shape of the first and second brush moving members 231 and 232 or the moving principle of the first and second brushes 211 and 212 are not limited to those shown in the drawing, and may have various shapes for supporting and moving the first and second brushes 211 and 212.

The wafer cleaning apparatus 22 according to an embodiment may include first and second spray devices 410 and 420 positioned adjacent to the wafer WF.

The first spray device 410 may be disposed to supply a cleaning solution and distilled water to the first surface WF1 of the wafer WF, and the second spray device 420 may be disposed to supply a cleaning solution and distilled water to the second surface WF2 of the wafer WF. In an embodiment, the first and second spray devices 410 and 420 may include a nozzle for spraying the cleaning solution and the distilled water toward the first and second surfaces WF1 and WF2 of the wafer WF, respectively.

The wafer WF may extend in the third direction Z perpendicular to the first direction X between the first brush 211 and the second brush 212. The first surface WF1 and the second surface WF2 of the wafer WF may face the first brush 211 and the second brush 212 in the first direction X, respectively.

The wafer WF may be a wafer on which various processes have been performed. For example, the wafer WF may be a semiconductor substrate on which a chemical mechanical polishing (CMP) process has been performed.

The wafer WF may include or may be formed of, for example, silicon (Si). In an embodiment, the wafer WF may include or may be formed of a semiconductor material such as germanium (Ge), or a compound semiconductor material such as silicon carbide (SiC), gallium arsenide (GaAs), indium arsenide (InAs), and indium phosphide) (InP).

The wafer cleaning apparatus 22 according to an embodiment may further include the wafer roller 500 configured to rotate the wafer WF.

The wafer roller 500 is positioned at an end point of the wafer WF, and may rotate the wafer WF. For example, the wafer roller 500 may rotatably contact an edge surface of the wafer WF to rotate the wafer WF around a normal direction of the first surface of the wafer WF (or a normal direction of the second surface thereof). The normal direction may be parallel to the first direction X. In an embodiment, the wafer roller 500 may rotatably hold the edge surface of the wafer WF for rotation around the normal direction of the wafer WF. For example, the wafer roller 500 may be configured such that the wafer WF may rotate around an axis parallel to the first direction X. Accordingly, the wafer WF may rotate around an axis perpendicular to the third direction Z that is an alignment direction of the wafer roller 500. In an embodiment, the wafer roller 500 may include or may be formed of an elastic material such as polyurethane, polyvinylidene fluoride, polyether ether ketone, polyether ether ketone, and quartz.

The wafer WF may be rotated by the wafer roller 500, and the first brush 211 and the second brush 212 may rotatably contact the first surface WF1 and the second surface WF2 of the wafer WF for cleaning the wafer WF, respectively.

The wafer roller 500 may rotatably contact the first surface WF1 and the second surface WF2 of the wafer WF and rotatably support the wafer WF. For example, the edge surface of the wafer WF may be connected to an outer perimeter of the first surface WF1 and an outer perimeter of the second surface WF2. The wafer roller 500 may rotatably contact the edge surface and portions of the first and second surfaces WF1 and WF2 adjacent to the edge surface for rotating and holding the wafer WF. In an embodiment, when the wafer roller 500 rotates clockwise, the wafer WF may rotate counterclockwise. In an embodiment, when the wafer roller 500 rotates counterclockwise, the wafer WF may rotate clockwise.

The wafer roller 500 may be rotated by a driving device such as a motor. Although FIG. 4 shows two wafer rollers 500 each of which rotatably contacts a portion of the edge surface of the wafer WF, the number of wafer rollers 500 is not limited thereto. For example, wafer cleaning apparatus 22 may include three or more wafer rollers 500. The present invention is not limited thereto. In an embodiment, the wafer cleaning apparatus 22 may include one wafer roller 500.

The first cleaning tank 310 may overlap the first brush 211 in the third direction Z that is a vertical direction, and the second cleaning tank 320 may overlap the second brush 212 in the third direction Z that is a vertical direction with respect to a floor on which the wafer cleaning apparatus 22 is installed. For example, the first cleaning tank 310 may be positioned apart from the first brush 211, and the second cleaning tank 320 may be positioned apart from the second brush 212.

In an embodiment, the first cleaning tank 310 may be positioned below the first brush 211 and overlap the first brush 211 in the third direction Z, and the second cleaning tank 320 may be positioned below the second brush 212 and overlap the second brush 212 in the third direction Z. However, the arrangement relationship between the first cleaning tank 310 and the first brush 211 and the second cleaning tank 320 and the second brush 212 is not limited thereto, and may be variously changed.

For example, the first cleaning tank 310 and the second cleaning tank 320 may not overlap the first brush 211 and the second brush 212 in the third direction Z, respectively.

First and second cleaning tanks 310 and 320 may be disposed side by side in the first direction X, and the first and second cleaning tanks 310 and 320 may overlap the first and second brushes 211 and 212 in the third direction Z, respectively, and extend in the same direction as an extension direction of each of the first and second brushes 211 and 212.

The wafer cleaning apparatus 22 according to an embodiment may further include a cleaning tank controller 340 configured to move the first cleaning tank 310 and the second cleaning tank 320 in the first direction X that is a horizontal direction with respect to a floor on which the wafer cleaning apparatus 22 is installed or in the third direction Z that is a vertical direction with respect to the floor.

For example, by the cleaning tank controller 340, the first cleaning tank 310 and the second cleaning tank 320 may be moved in the third direction Z that is the vertical direction and may accommodate at least a portion of the first brush 211 and at least a portion of the second brush 212, respectively.

Although not shown in FIG. 2, the first cleaning tank 310 and the second cleaning tank 320 may further include a cleaning tank movement member (not shown) and a cleaning tank driving member (not shown) configured to apply driving force to the cleaning tank movement member, and the first cleaning tank 310 and the second cleaning tank 320 may be moved by the cleaning tank movement member.

The wafer cleaning apparatus 22 according to an embodiment may further include the first solution supply pipe 351 connected to the first cleaning tank 310, the first solution supply member 361 (i.e., a first solution source) configured to supply a first cleaning chemical solution to the first cleaning tank 310 through the first solution supply pipe 351, the second solution supply pipe 352 connected to the second cleaning tank 320, and the second solution supply member 362 (i.e., a second solution source) configured to supply a second cleaning chemical solution to the second cleaning tank 320 through the second solution supply pipe 352. In an embodiment, the first cleaning chemical solution may be the same as the second cleaning chemical solution.

The first and second solution supply members 361 and 362 may supply the first and second cleaning chemical solution for cleaning first and second brushes 210 and 220 into the first and second cleaning tanks 310 and 320, respectively. For example, the first and second cleaning chemical solutions may include or may be formed of at least one of deionized water, DI water, ultrapure water, or hydrofluoric acid (HF), sulfuric acid (H3SO4), nitric acid HNO3, phosphoric acid (H3PO4), SC-1 (standard clean-1) solution, EKC solution, LAL solution, and diluted sulfate peroxide (DSP) solution.

In an embodiment, the first and second cleaning chemical solutions for cleaning the first and second brushes 210 and 220 may further include gas such as oxygen (O2) and nitrogen (N2).

Although not shown in FIG. 2, in some embodiments, the wafer cleaning apparatus 22 may further include a gas supply member (not shown) configured to supply gas such as oxygen (O2) and nitrogen (N2) to the first and second solution supply members 361 and 362.

A first end of the first solution supply pipe 351 may be connected to the first cleaning tank 310, and a second end of the first solution supply pipe 351 may be connected to the first solution supply member 361. A first end of the second solution supply pipe 352 may be connected to the second cleaning tank 320, and a second end of the second solution supply pipe 352 may be connected to the second solution supply member 362.

FIG. 2 shows that each of the first solution supply pipe 351 and the second solution supply pipe 352 is shown as two, but the number of the first solution supply pipe 351 and the second solution supply pipe 352 is not limited thereto, and may be variously changed.

The wafer cleaning apparatus 22 according to an embodiment may further include a first bubble generation member 371 connected to the first solution supply pipe 351 and a second bubble generation member 372 connected to the second solution supply pipe 352. For example, first and second bubble generation members 371 and 372 may be a microbubble generator. In an embodiment, each of the first and second bubble generation members 371 and 372 may be a bubble generator which generates bubbles into the first and second cleaning chemical solutions, respectively. In an embodiment, each of the first and second bubble generation members 371 and 372 may include a bubble-generating element such as a porous material.

The first bubble generation member 371 may be connected to the first solution supply pipe 351 positioned between the first cleaning tank 310 and the first solution supply member 361, and the second bubble generation member 372 may be connected to the second solution supply pipe 352 positioned between the second cleaning tank 320 and the second solution supply member 362. However, positions of the first and second bubble generation members 371 and 372 are not limited thereto, and may be variously changed.

Accordingly, solutions supplied from the first and second bubble generation members 371 and 372 may include or may be provided with bubbles generated by the first and second bubble generation members 371 and 371.

Hereinafter, the first cleaning tank 310 and the second cleaning tank 320 according to an embodiment will be described in detail with further reference to FIG. 5 to FIG. 8B.

According to an embodiment, the first cleaning tank 310 may include a first solution injection member 311, a first main heating member 312, and a first solution discharge member 313, and the second cleaning tank 320 may include a second solution injection member 321, a second main heating member 322, and a second solution discharge member 323.

Since the first cleaning tank 310 and the second cleaning tank 320 have substantially the same configuration and structure, the first cleaning tank 310 will be mainly described below. Since the description of the first cleaning tank 310 may be substantially equally applied to the second cleaning tank 320, the description of the second cleaning tank 320 will be omitted.

The first cleaning tank 310 may extend in the second direction Y that is the extension direction of the first and second brushes 211 and 212 when viewed in a plan view, and may include a first side surface 310S1 and a second side surface 310S2 that face each other.

The first cleaning tank 310 may extend along the first direction X that crosses the second direction Y that is the extension direction of the first and second brushes 211 and 212 when viewed in a plan view, and may include a third side surface 310S3 and a fourth side surface 310S4 that face each other. A first end of the first side surface 310S1 and a first end of the second side surface 310S2 may be connected to and intersect the third side surface 310S3, and a second end of the first side surface 310S1 and a second end of the second side surface 310S2 may be connected to and intersect the fourth side surface 310S4.

Each of lengths of the first side surface 310S1 and the second side surface 310S2 along the second direction Y may be greater than each of lengths of the third side surface 310S3 and the fourth side surface 310S4 along the first direction X.

The first side surface 310S1 and the second side surface 310S2 of the first cleaning tank 310 may extend from a bottom surface 310B of the first cleaning tank 310 in a first diagonal direction and a second diagonal direction between the first direction X and the third direction Z, respectively.

In an embodiment, an angle θ formed between the first side surface 310S1 and the bottom surface 310B and between the second side surface 310S2 and the bottom surface 310B of the first cleaning tank 310 may be an obtuse angle. For example, the angle θ formed between the first side surface 310S1 and the bottom surface 310B and between the second side surface 310S2 and the bottom surface 310B may be 120 degrees or more. However, the angle θ formed between the first side surface 310S1 and the bottom surface 310B and between the second side surface 310S2 and the bottom surface 310B is not limited thereto, and may be variously changed.

When the angle θ formed between the first side surface 310S1 and the bottom surface 310B and between the second side surface 310S2 and the bottom surface 310B is an obtuse angle, the first brush 211 may be accommodated in the first cleaning tank 310 without interference of the first side surface 310S1 and the second side surface 310S2.

Lengths of the first side surface 310S1 and the second side surface 310S2 extending from the bottom surface 310B of the first cleaning tank 310 in the diagonal direction between the first direction X and the third direction Z may be longer than a length of each of the third side surface 310S3 and the fourth side surface 310S4 extending from the bottom surface 310B in the third direction Z. For example, end points of the first side surface 310S1 and the second side surface 310S2 may be positioned higher than end points of the third side surface 310S3 and the fourth side surface 310S4.

In an embodiment, the first side surface 310S1 and the second side surface 310S2 each of the first cleaning tank 310 may include first portions 310S1a and 310S2a connected to the third side surface 310S3 and the fourth side surface 310S4, and second portions 310S1b and 310S2b further extending from the first portions 310S1a and 310S2a in the diagonal direction between the first direction X and the third direction Z.

For example, the first portions 310S1a and 310S2a of each of the first side surface 310S1 and the second side surface 310S2 may extend from the bottom surface 310B to end points of the third side surface 310S3 and the fourth side surface 310S4 along the diagonal direction between the first direction X and the third direction Z.

The second portions 310S1b and 310S2b of each of the first side surface 310S1 and the second side surface 310S2 may extend from the first portions 310S1a and 310S2a in the diagonal direction between the first direction X and the third direction Z, and may include the second portions 310S1b and 310S2b positioned at a level higher than those of end points of the third side surface 310S3 and the fourth side surface 310S4.

A second portion 310S1b of the first side surface 310S1 of the first cleaning tank 310 and a second portion 310S2b of the second side surface 310S2 may serve to prevent the solution from being scattered outside the first cleaning tank 310 in the process of accommodating and cleaning the first brush 211 in the first cleaning tank 310.

The first cleaning tank 310 may include a solution accommodator 310R (i.e., a solution storage bin with open top or a solution storage box with open top) defined by the bottom surface 310B, a first portion 310S1a of the first side surface 310S1, a first portion 310S2a of the second side surface 310S2, the third side surface 310S3, and the fourth side surface 310S4.

The solution supplied from the first solution supply member 361 may be accommodated in the solution accommodator 310R of the first cleaning tank 310, and at least a portion of the first brush 211 may be accommodated in the solution accommodator 310R.

As the first side surface 310S1 and the second side surface 310S2 of the first cleaning tank 310 extend from the bottom surface 310B of the first cleaning tank 310 in the diagonal direction between the first direction X and the third direction Z, and the solution accommodator 310R of the first cleaning tank 310 may have an increasing width from the bottom surface 310B toward the open top in the third direction Z. The width of the solution accommodator 310R may be measured in the first direction X.

Accordingly, when viewed from the second direction Y, the solution accommodator 310R of the first cleaning tank 310 may have an inverted trapezoidal shape. For example, the third side surface 310S3 forming a first side surface of the solution accommodator 310R and the fourth side surface 310S4 forming a second side surface thereof may have a width in the first direction X increasing in the third direction Z from the bottom surface 310B. Here, the second direction Y may refer to a direction in which the first cleaning tank 310 is viewed from the front.

Referring to FIG. 4 together with FIG. 2, a diameter D1 of the first brush 211 may be greater than a depth D2 of the solution accommodator 310R of the first cleaning tank 310. For example, the diameter D1 of the first brush 211 may be about twice the depth D2 of the solution accommodator of the first cleaning tank 310. However, the relationship between the diameter D1 of the first brush 211 and the depth D2 of the solution accommodator 310R of the first cleaning tank 310 is not limited thereto and may be variously changed. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Here, the diameter D1 of the first brush 211 may mean a maximum straight line distance between an end point of a protrusion 211c positioned on a first side surface of a first brush member 211b and an end point of the protrusion 211c positioned a second side surface of the first brush member 211b. For example, the diameter D1 may correspond to a maximum distance between end points of two opposite protrusion portions of the plurality of protrusion portions. In an embodiment, the two opposite protrusion portions may be arranged along a straight line extending through a rotation axis of the first brush rotation shaft 211a, around which the first brush rotation shaft 211a rotates.

The depth D2 of the solution accommodator 310R of the first cleaning tank 310 may mean a maximum straight line distance along the third direction Z between the bottom surface 310B and the third side surface 310S3 or between the bottom surface 310B and an end point of the fourth side surface 310S4.

The first solution injection member 311 may be disposed on a side surface of the first cleaning tank 310. For example, the first solution injection member 311 may be disposed on each of the third side surface 310S3 and the fourth side surface 310S4 of the first cleaning tank 310.

The first solution injection member 311 may be connected to a solution implant hole 310H penetrating the third side surface 310S3 and the fourth side surface 310S4 of the first cleaning tank 310. For example, the first solution injection member 311 may connect the solution implant hole 310H and the first solution supply pipe 351 positioned on each of the third side surface 310S3 and the fourth side surface 310S4.

The wafer cleaning apparatus 22 according to an embodiment may include a plurality of first solution injection members 311. For example, two first solution injection members 311 may be disposed on each of the third side surface 310S3 and the fourth side surface 310S4 of the first cleaning tank 310. The first solution injection members 311 disposed on each of the third side surface 310S3 and the fourth side surface 310S4 may be arranged side by side along the first direction X. However, the number and arrangement of the first solution injection member 311 are not limited thereto, and may be variously changed. For example, one or two or more first solution injection members 311 may be disposed, and when a plurality of first solution injection members 311 are disposed, the first solution injection member 311 may be arranged along the third direction Z.

As shown in FIG. 7, the first solution injection member 311 may include a coupling member 311a, a bubble generating filter 311b, and a sub-heating member 311F.

The coupling member 311a may serve as a connector that connects the first solution supply pipe 351 to the solution implant hole 310H of the first cleaning tank 310. For example, one end of the coupling member 311a is connected to the first solution supply pipe 351, and the other end of the coupling member 311a is connected to the solution implant hole 310H of the first cleaning tank 310. The coupling member 311a may also serve as a frame that surrounds the bubble generating filter 311b and the sub-heating member 311F, and that supports the bubble generating filter 311b and the sub-heating member 311F.

The sub-heating member 311F may include a first sub-heating member 311c, a second sub-heating member 311d, and a third sub-heating member 311e. FIG. 7 shows that the first sub-heating member 311c, the second sub-heating member 311d, and the third sub-heating member 311e are formed as separate elements, but in some embodiments, the first sub-heating member 311c, the second sub-heating member 311d, and the third sub-heating member 311e may be integrally formed. The sub-heating member 311F may correspond to a heating element dissipating heat according to the control of a heater which is connected to the sub-heating member 311F.

The first sub-heating member 311c may be positioned on a central portion of the bubble generating filter 311b. The first solution injection member 311 according to an embodiment may include a plurality of second sub-heating members 311d.

The plurality of second sub-heating members 311d may extend from the central portion of the bubble generating filter 311b toward the outer side thereof. For example, the plurality of second sub-heating members 311d may extend from the first sub-heating member 311c toward the outer side of the bubble generating filter 311b. For example, in a cross-sectional view, the plurality of second sub-heating members 311d may radially extend from the first sub-heating member 311c toward a side surface of the bubble generating filter 311b. Accordingly, in a cross-sectional view, a distance between adjacent second sub-heating members 311*d* may become greater from the central portion toward the outer side of the bubble generating filter 311*b*.

The third sub-heating member 311*e* may surround the side surface of the bubble generating filter 311*b*. Each of the second sub-heating members 311*d* may extend outward from the first sub-heating member 311*c* and may be connected to the third sub-heating member 311*e*.

The first sub-heating member 311*c*, the second sub-heating members 311*d*, and the third sub-heating member 311*e* may be an electrical heating element such as an element that generates heat by using electric joule heating or a Peltier element. However, the way of generating heat of the first sub-heating member 311*c*, the second sub-heating member 311*d*, and the third sub-heating member 311*e* is not limited thereto, and may be variously changed.

The bubble generating filter 311*b* may include a plurality of through-holes 311H penetrating the bubble generating filter 311*b*. Accordingly, while the solution supplied to the first cleaning tank 310 passes through a through-hole 311H, a plurality of bubbles may be generated in the solution. A detailed description thereof will be described later with reference to FIG. 11.

The plurality of through-holes 311H may be positioned in spaces between two adjacent second sub-heating members of the second sub-heating members 311*d*. Since a distance between adjacent second sub-heating members 311*d* becomes greater from the central portion to the outer side of the bubble generating filter 311*b*, the number of the plurality of through-holes 311H positioned between the second sub-heating members 311*d* may be larger from the central portion to the outer side of the bubble generating filter 311*b*. For example, the plurality of through-holes 311H may be arranged in such a way that the number of the plurality of through-holes 311H increases from the central portion to the outer side of the bubble generating filter 311*b*.

The first main heating member 312 may be positioned at side surfaces of the first cleaning tank 310. For example, the first main heating member 312 may be positioned on each of the first side surface 310S1 and the second side surface 310S2 of the first cleaning tank 310.

Referring to FIG. 8A and FIG. 8B together with FIG. 5 and FIG. 6, the first main heating member 312 according to an embodiment may be positioned on each of the first side surface 310S1 and the second side surface 310S2 of the first cleaning tank 310, and may extend along the second direction Y that is an extension direction of the first side surface 310S1 and the second side surface 310S2. Here, the second direction Y, which is the extension direction of the first side surface 310S1 and the second side surface 310S2, may mean an extension direction of the first brush 211.

As shown in FIG. 6 and FIG. 8A, the first main heating member 312 may be positioned on a side surface of the solution accommodator 310R of the first cleaning tank 310. For example, the first main heating member 312 may be positioned on the first portion 310S1*a* of the first side surface 310S1 and the first portion 310S2*a* of the second side surface 310S2 of the first cleaning tank 310.

The first main heating member 312 may extend from the first side surface 310S1 and the second side surface 310S2 of the first cleaning tank 310 along the second direction Y and the third direction Z, and may have a plate shape. However, the number and arrangement of the first main heating member 312 are not limited thereto, and may be variously changed.

For example, as shown in FIG. 8B, the first main heating member 312 may include a plurality of elements. In an embodiment, the first main heating member 312 may include a plurality of heating elements such as metal wires, straight or coiled That is, the first main heating member 312 may be positioned at the first side surface 310S1 and the second side surface 310S2 of the first cleaning tank 310, and may include a first line main heating member 312*a* (i.e., a first heating element), a second line main heating member 312*b* (i.e., a second heating element), a third line main heating member 312*c* (i.e., a third heating element), and a fourth line main heating member 312*d* (i.e., a fourth heating element) that extend along the second direction Y to have a linear form. In an embodiment, the first to fourth line main heating members 312*a* to 312*d* may be straight or coiled.

The first line main heating member 312*a*, the second line main heating member 312*b*, the third line main heating member 312*c*, and the fourth line main heating member 312*d* may be arranged apart from each other in the third direction Z.

The solution discharge member 313 may be positioned on the bottom surface 310B of the first cleaning tank 310. The solution discharge member 313 may be connected to a solution discharging hole 313H that penetrates the bottom surface 310B of the first cleaning tank 310. For example, the solution discharge member 313 may be a flexible hose. The solution discharge member 313 may be connected to the solution discharging hole 313H, and may discharge the solution accommodated in the first cleaning tank 310 to the outside.

The first cleaning tank 310 of the wafer cleaning apparatus 22 according to an embodiment may include a plurality of solution discharging holes 313H and a plurality of solution discharge members 313 connected thereto respectively.

The plurality of solution discharging holes 313H may have a circular shape when viewed in a plan view, and may be disposed on the bottom surface 310B of the first cleaning tank 310. The plurality of solution discharging holes 313H may be arranged side by side along the second direction Y that is an extension direction of the first cleaning tank 310 in the bottom surface 310B of the first cleaning tank 310. The plurality of solution discharge members 313 may be connected to the plurality of solution discharging holes 313H, respectively, and may extend along the third direction Z that is a vertical direction with respect to a floor on which the wafer cleaning apparatus 22 is installed. However, the planar shape, number, and arrangement of the solution discharging hole 313H is not limited thereto, and may be variously changed.

Hereinafter, the process of cleaning the first and second brushes 211 and 212 will be described with further reference to FIG. 9 to FIG. 11.

Figure 9:
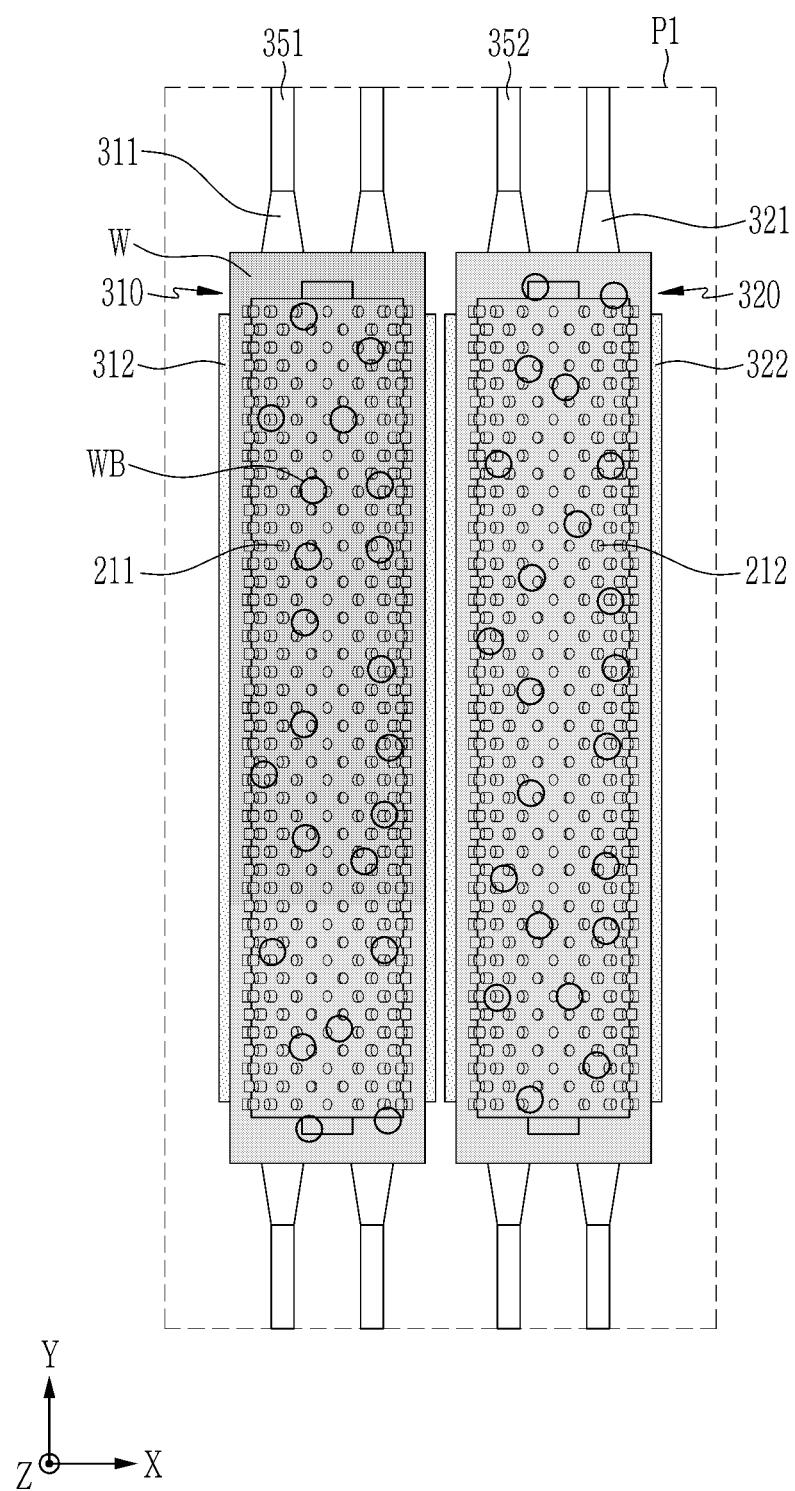
FIG. 9 is a partial enlarged view for explaining a process of cleaning a brush of a wafer cleaning apparatus according to an embodiment.

FIG. 9 is a partial enlarged view for explaining a process of cleaning a brush of a wafer cleaning apparatus according to an embodiment. FIG. 10 is a front view schematically showing a process of cleaning a brush of a wafer cleaning apparatus according to an embodiment. FIG. 9 may correspond to region P1 of FIG. 2.

Figure 10:
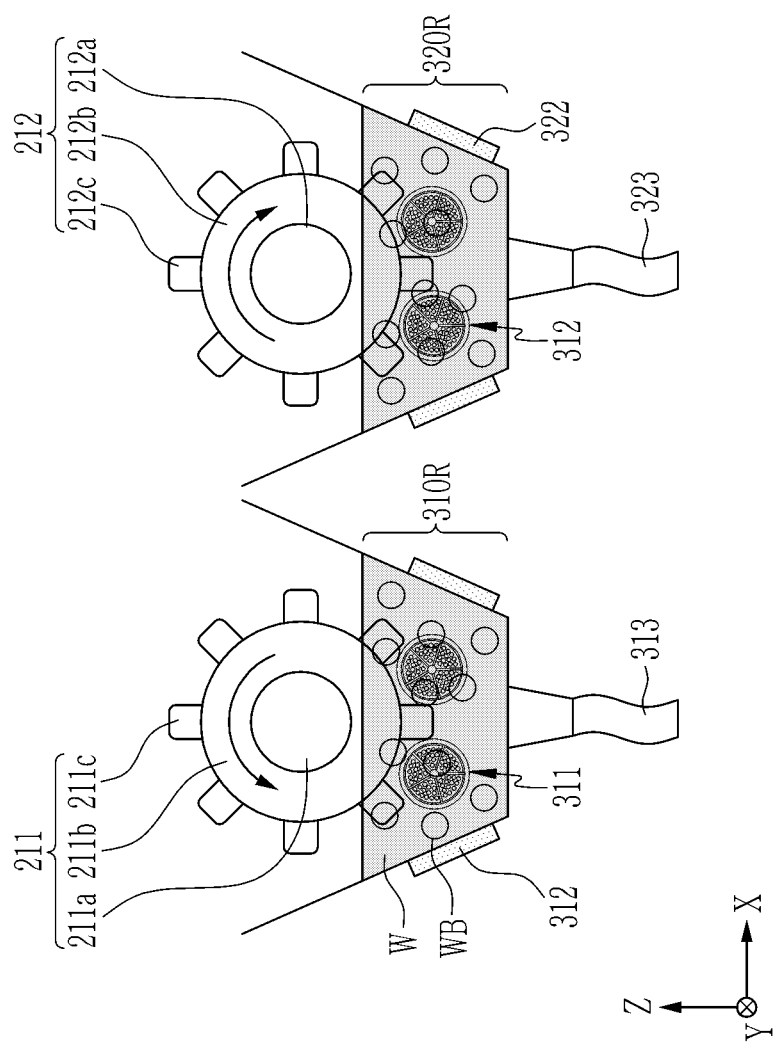
FIG. 10 is a front view schematically showing a process of cleaning a brush of a wafer cleaning apparatus according to an embodiment.

Referring further to FIG. 9 to FIG. 10 together with FIG. 2, after the first brush 211 and the second brush 212 finish the cleaning of the wafer WF, when the wafer WF is removed from between the first brush 211 and the second brush 212, the first brush 211 and the second brush 212 may move in the first direction X by the brush controller 250.

After the first brush 211 and the second brush 212 finish the cleaning of the wafer WF, when the wafer WF is removed from between the first brush 211 and the second brush 212, the cleaning tank controller 340 may control the first cleaning tank 310 and the second cleaning tank 320 to move in the third direction Z that is a vertical direction with respect to a floor on which the wafer cleaning apparatus 22 is installed and to accommodate at least a portion of the first brush 211 and at least a portion the second brush 212, respectively.

Accordingly, the first cleaning tank 310 and the second cleaning tank 320 may accommodate at least a portion of the first brush 211 and the second brush 212, respectively. As the first and second brushes 211 and 212 and the first and second cleaning tanks 310 and 320 are simultaneously moved, cleaning efficiency of the first and second brushes 211 and 212 may be improved.

As described above in FIG. 4, since the diameter D1 of the first brush 211 and the second brush 212 is larger than the depth D2 of the first cleaning tank 310 and the second cleaning tank 320, a portion of the first brush 211 and a portion of the second brush 212 may be accommodated in the solution accommodators 310R and 320R of the first cleaning tank 310 and the second cleaning tank 320, respectively.

Accordingly, a portion of the first brush 211 and a portion of the second brush 212 are accommodated in the first cleaning tank 310 and the second cleaning tank 320, respectively, and a remaining portion of the first brush 211 and a remaining portion of the second brush 212 may protrude from the first cleaning tank 310 and the second cleaning tank 320 to be exposed, respectively.

Subsequently, a solution W may be supplied from the first and second solution supply members 361 and 362 to the solution accommodators 310R and 320R of the first and second cleaning tanks 310 and 320. The supply of the solution W may be continued until the solution W reaches a predetermined liquid height of the solution accommodators 310R and 320R.

When the solution W reaches the predetermined liquid height of the solution accommodators 310R and 320R, the supply of the solution W from the first and second solution supply members 361 and 362 to the first and second cleaning tanks 310 and 320 may be stopped.

Here, the solution W is a cleaning solution for cleaning the first and second brushes 211 and 212, and may include at least one of the solutions described above.

The solution W supplied from the first and second solution supply members 361 and 362 to the solution accommodators 310R and 320R of the first and second cleaning tanks 310 and 320 may include the plurality of bubbles WB. A detailed description thereof will be described later with reference to FIG. 11.

When the solution W is supplied to the solution accommodators 310R and 320R of the first and second cleaning tanks 310 and 320, a temperature of the solution W may be raised by the first and second main heating members 312 and 322. As the temperature of the solution W accommodated in the solution accommodators 310R and 320R is raised, removal of contaminants remaining on surfaces of the first and second brushes 211 and 212 may be accelerated.

As the temperature of the solution W supplied to the solution accommodators 310R and 320R is raised, generation of bubbles WB in the solution W accommodated in the solution accommodators 310R and 320R may be accelerated.

When the supply of the solution W to the solution accommodators 310R and 320R of the first and second cleaning tanks 310 and 320 is finished, portions of the first and second brushes 211 and 212 may be submerged into the solution W. For example, portions of the first and second brush members 211b and 212b and portions of the protrusions 211c and 212c of the first and second brushes 211 and 212 may be submerged into the solution W, and the first and second brush rotation shafts 211a and 212a of the first and second brushes 211 and 212 may be exposed above the solution W.

In an embodiment, portions of the first and second brush rotation shafts 211a and 212a, the portions of the first and second brush members 211b and 212b, and the portions of the protrusions 211c and 212c of the first and second brushes 211 and 212 may be submerged into the solution W. However, the arrangement relationship between the first and second brushes 211 and 212 and the solution W is not limited thereto, and may be variously changed.

The first and second brush members 211b and 212b and the protrusions 211c and 212c of the first and second brushes 211 and 212 accommodated in the first and second cleaning tanks 310 and 320 may be cleaned by the solution W supplied to the first and second solution accommodators 310R and 320R. As described above, since the first and second brushes 211 and 212 may rotate in different directions, as the first and second brushes 211 and 212 are rotated, front surfaces of the first and second brush members 211b and 212b and front surfaces of the protrusions 211c and 212c may contact the solution W and may be cleaned.

After the cleaning of the first and second brushes 211 and 212 is completed, the solution W supplied to the first and second solution accommodators 310R and 320R by the first and second solution discharge members 313 and 323 positioned on the bottom surfaces 310B and 320B of the first and second cleaning tanks 310 and 320 may be discharged.

Figure 11:
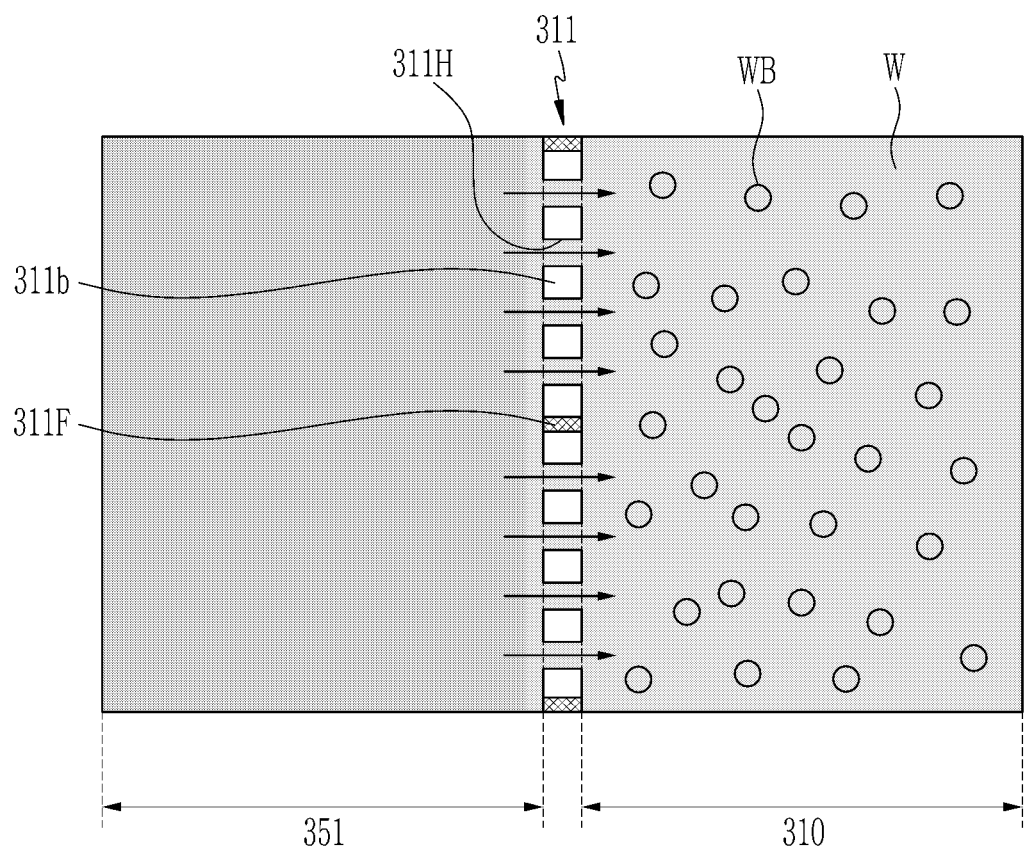
FIG. 11 is a drawing schematically showing a process of generating bubbles in a solution provided to a cleaning tank.

FIG. 11 is a drawing schematically showing a process of generating bubbles in a solution provided to a cleaning tank.

FIG. 11 illustrates a process in which bubbles are generated in the solution W supplied to the first cleaning tank 310, and will be described below with reference to the first cleaning tank 310. Since the process of generating bubbles in the solution W supplied to the first cleaning tank 310 may be applied to the second cleaning tank 320 in substantially the same way, a description thereof will be omitted.

As shown in FIG. 11, the solution W supplied from the first solution supply member 361 may include the plurality of bubbles WB generated while passing through the first solution injection member 311 connected to the first cleaning tank 310.

For example, the solution W supplied from the first solution supply member 361 and moving to the first cleaning tank 310 along the first solution supply pipe 351 may include the plurality of bubbles WB generated while passing through a first bubble generating filter 311b of the first solution injection member 311.

A pressure of the solution W passing through the first bubble generating filter 311b having a relatively narrow width compared to a width of the first solution supply pipe 351 may be locally lowered below a saturated vapor pressure, and thereby cavitation bubbles may be generated.

As the temperature of the solution W passing through the first solution injection member 311 is raised by the sub-heating member 311F of the first solution injection member 311, the oxygen saturation rate of the solution W is decreased, and generation of the bubble WB in the solution W passing through the first solution injection member 311 may be accelerated.

When cleaning the first brush 211, the plurality of bubbles WB generated in the solution W supplied to the first solution accommodator 310R may perform removing contaminants remaining on a surface of the first brush 211 by entering a space between the protrusions 211c of the first brush 211 and bursting there. Accordingly, contaminants remaining on the surface of the first brush 211 may be effectively removed.

Since the wafer cleaning apparatus 22 according to an embodiment includes the first cleaning tank 310 and the second cleaning tank 320 capable of cleaning the first and second brushes 211 and 212, particles (e.g., slurry residue, polishing debris, or the like) attached to the first and second brushes 211 and 212 may be removed, and contamination of the cleaned wafer WF by the first and second brushes 211 and 212 may be prevented, thereby improving cleaning efficiency of the wafer WF.

When the first and second brushes 211 and 212 are cleaned by being accommodated into the first cleaning tank 310 and the second cleaning tank 320 supplied with the solution W including the plurality of bubbles WB, in comparison with the case of cleaning the first and second brushes 211 and 212 through a separate brush cleaning apparatus, the surfaces of the first and second brushes 211 and 212 may be effectively cleaned, and wear of the first and second brushes 211 and 212 may be prevented.

Hereinafter, a wafer cleaning apparatus according to various embodiments will be described with reference to FIG. 12A to FIG. 26. In the following embodiments, the same reference numerals refer to components identical to those of the previously described embodiments, and redundant descriptions will be omitted or simplified, and description will focus on differences.

Since a plurality of cleaning tanks of the wafer cleaning apparatus have the same configuration and structure, the following embodiments will be described based on one cleaning tank.

Figure 12A:
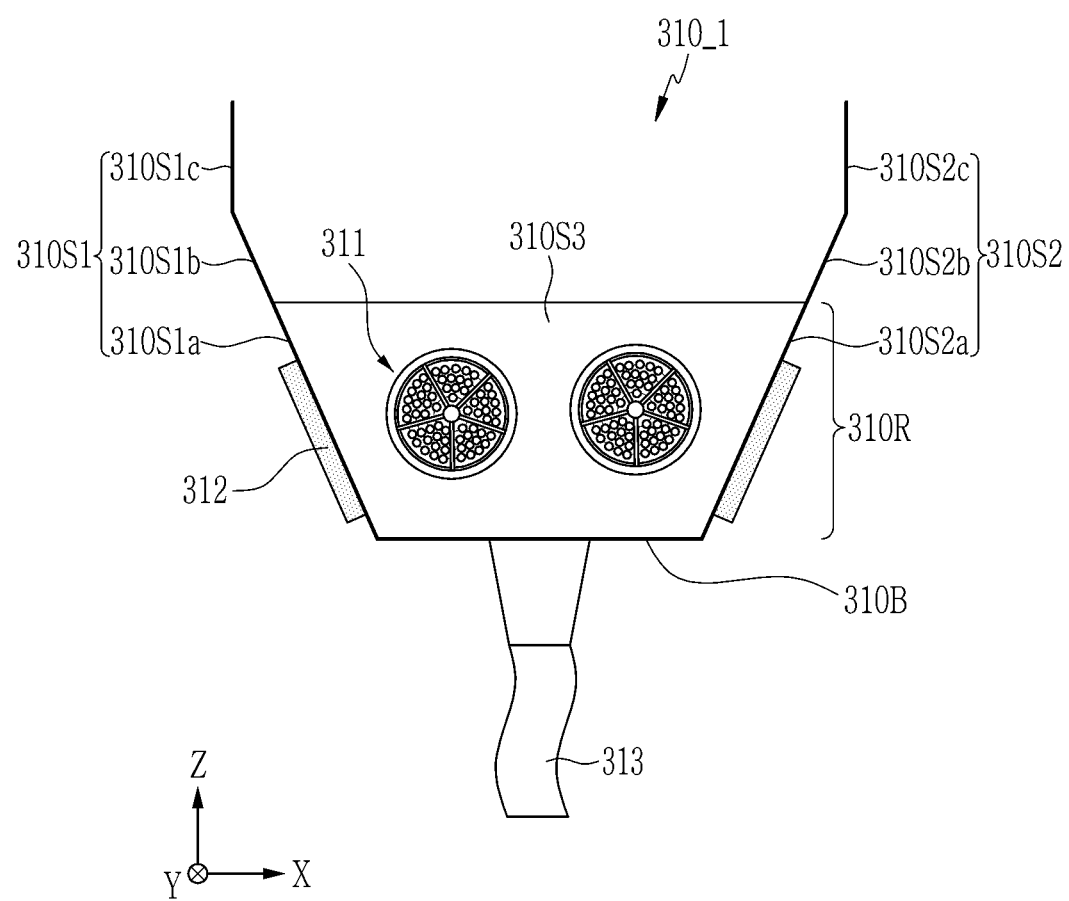
FIG. 12A to FIG. 12C are front views schematically showing a cleaning tank of a wafer cleaning apparatus according to some embodiments.
Figure 12B:
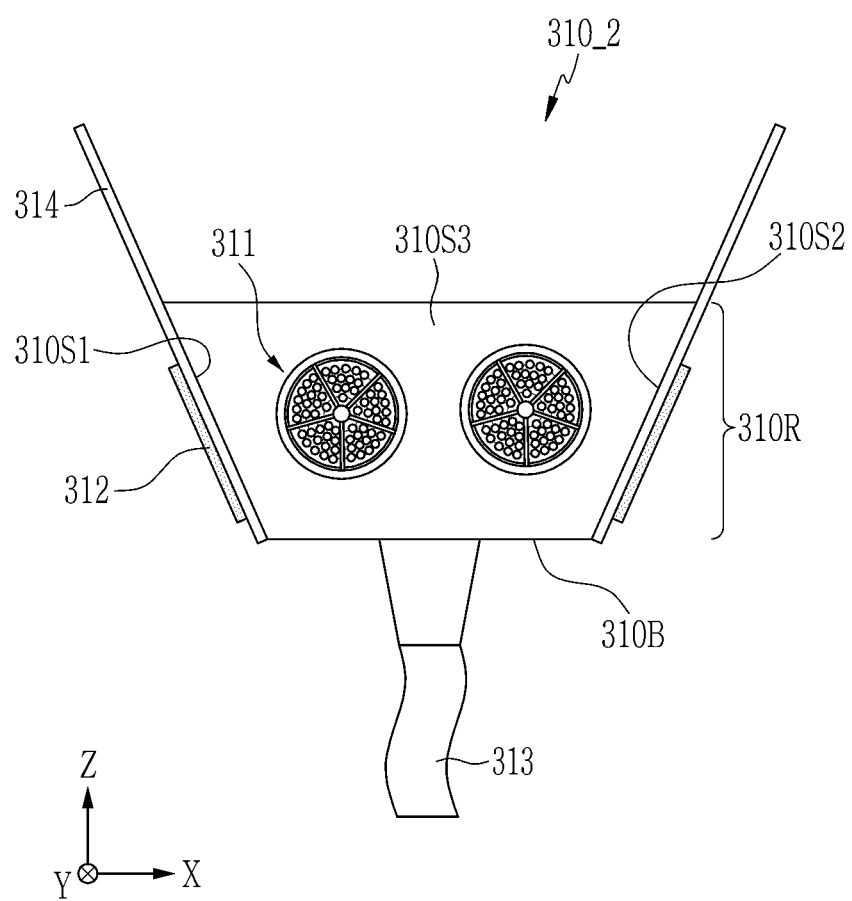
Figure 12C:
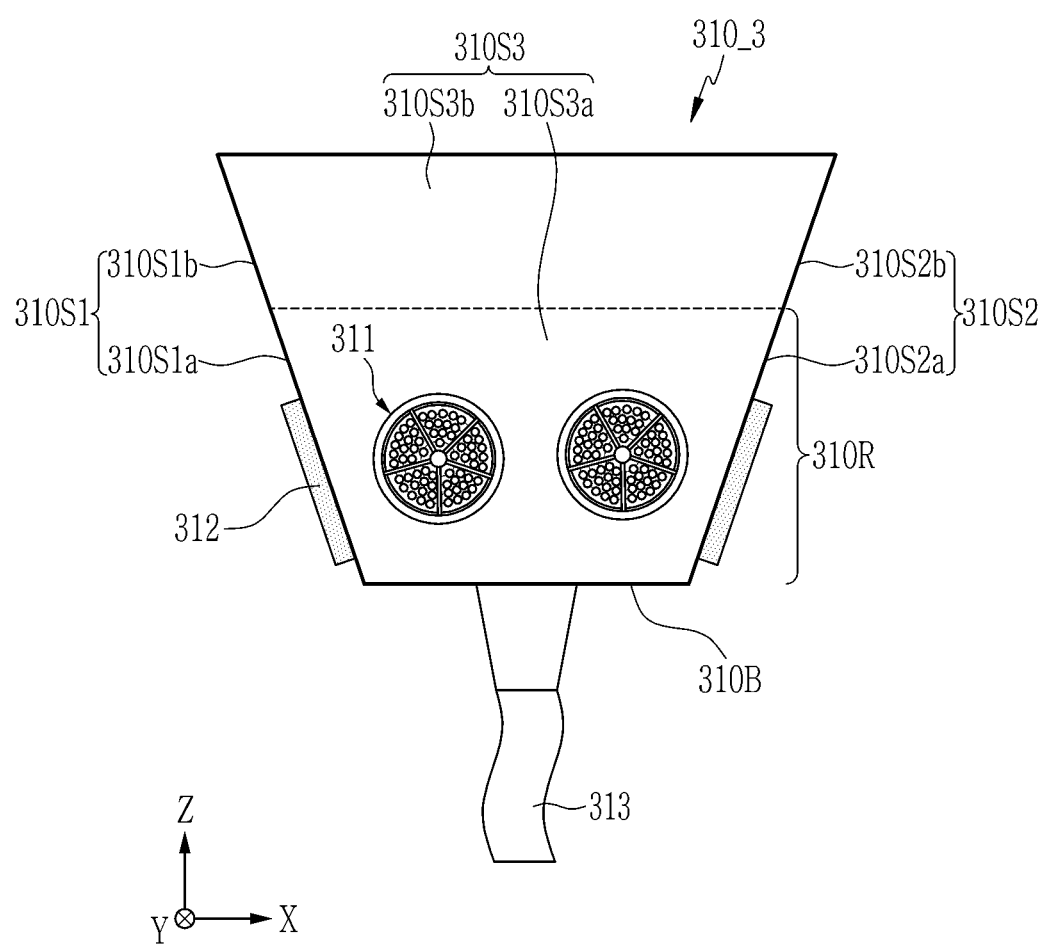

FIG. 12A to FIG. 12C are front views schematically showing a cleaning tank of a wafer cleaning apparatus according to some embodiments.

According to an embodiment as shown in FIG. 12A, the first cleaning tank 310_1, unlike the first cleaning tank 310 according to an embodiment as shown in FIG. 6, may include the first side surface 310S1 and the second side surface 310S2 with third portions 310S1c and 310S2c that further extend from the second portions 310S1b and 310S2b in the third direction Z that is a vertical direction with respect to a floor on which the wafer cleaning apparatus 22 is installed.

For example, the first side surface 310S1 and the second side surface 310S2 of the first cleaning tank 310_1 may include the first portions 310S1a and 310S2a connected to the third side surface 310S3 in the first direction X, the second portions 310S1b and 310S2b further extending from the first portions 310S1a and 310S2a in the diagonal direction between the first direction X and the third direction Z, and the third portions 310S1c and 310S2c further extending from the second portions 310S1b and 310S2b in the third direction Z.

For example, the second portions 310S1b and 310S2b and the third portions 310S1c and 310S2c of the first side surface 310S1 and the second side surface 310S2 of the first cleaning tank 310_1 may be positioned at a level higher than the first solution accommodator 310R of the first cleaning tank 310_1 (i.e., an end point of each of the third and fourth side surfaces 310S3 and 310S4).

Since the first side surface 310S1 and the second side surface 310S2 of the first cleaning tank 310_1 according to the present embodiment further includes the third portions 310S1c and 310S2c, in comparison with the first cleaning tank 310 according to an embodiment shown in FIG. 6, in the process of cleaning the first brush (refer to '211' of FIG. 2) with the solution supplied to the first solution accommodator 310R, scattering of the solution to the outside of the first cleaning tank 310_1 may be more effectively prevented.

The first cleaning tank 310_2 according to an embodiment as shown in FIG. 12B, unlike the first cleaning tank 310 according to an embodiment as shown in FIG. 6, may further include a scattering prevention member 314.

According to the present embodiment, the scattering prevention member 314 may be disposed on each of the first side surface 310S1 and the second side surface 310S2 of the first cleaning tank 310_2. For example, the scattering prevention member 314 may be disposed between the first side surface 310S1 of the first cleaning tank 310_2 and the first main heating member 312 and between the first main heating member 312 and the second side surface 310S2.

The scattering prevention member 314 may extend from the bottom surface 310B of the first cleaning tank 310_2 along the first side surface 310S1 and the second side surface 310S2. For example, the scattering prevention member 314 may extend an outer side of the first side surface 310S1 and the second side surface 310S2 along the diagonal direction between the first direction X and the third direction Z. An end point of the scattering prevention member 314 may be positioned at a level higher than the end point of the first solution accommodator 310R of the first cleaning tank 310_2. For example, the end point of the scattering prevention member 314 may be positioned at a level higher than an end point of the third side surface 310S3 of the first cleaning tank 310_2. In an embodiment, the scattering prevention member 314 may extend beyond an end point of each of the first and second side surfaces 310S1 and 310S2 to further prevent scattering of the solution provided into the first solution accommodator 310R. In an embodiment, the scattering prevention member 314 and the first cleaning tank 310_2 may include or may be formed of a etch-resistant (or a corrosion-resistant) material with respect to the solution accommodated by the first cleaning tank 310_2. For example, the scattering prevention member 314 and the first cleaning tank 310_2 may include or may be formed of a stainless steel such as Austenite type (e.g., STS304, STS316, STS316L, STS301, STS321, etc.), a Ferrite type (e.g., STS430, STS430J1L, STS409L, etc.), a Martensite type (e.g. STS410, STS420J1L, STS420L2, etc.), a Duplex type (e.g., STS2205, STS2304, STS2507, etc.), and a precipitation hardening type (e.g., STS630, STS631, etc). In an embodiment, the first cleaning tank 310_2 and the scattering prevention member 314 may be formed of the same material. The present invention is not limited thereto. For example, the scattering prevention member 314 and the first cleaning tank 310_2 may include or may be formed of etch-resistant (or a corrosion-resistant) materials different from each other.

The first cleaning tank 310_2 according to the present embodiment may have substantially the same effect as an embodiment shown in FIG. 6.

According to the first cleaning tank 310_3 according to an embodiment as shown in FIG. 12C, unlike the first cleaning tank 310 according to an embodiment shown in FIG. 6, the end point of the third side surface 310S3 connected to the first side surface 310S1 and the second side surface 310S2 is positioned at a level higher than the end point of the first solution accommodator 310R of the first cleaning tank 310_3.

The end point of the third side surface 310S3 of the first cleaning tank 310_3 may be positioned at substantially the same level as the end point of the first side surface 310S1 and an end point of the second side surface 310S2.

For example, the third side surface 310S3 of the first cleaning tank 310_3 may include a first portion 310S3a connected to the first portions 310S1a and 310S2a of the first side surface 310S1 and the second side surface 310S2, and a second portion 310S3b connected to the second portions 310S1b and 310S2b of the first side surface 310S1 and the second side surface 310S2.

Although FIG. 12C does not illustrate the fourth side surface (refer to '310S4' of FIG. 6) facing the third side surface 310S3 of the first cleaning tank 310_3 in the second direction Y, the description with respect to the third side surface 310S3 of the first cleaning tank 310_3 may be substantially equally applied to the fourth side surface (refer to '310S4' of FIG. 6).

Since the end points of the third side surface 310S3 and the fourth side surface ('310S4' of FIG. 6) connected to the first side surface 310S1 and the second side surface 310S2 of the first cleaning tank 310_3 according to the present embodiment are further extended to be positioned at a level higher than the first solution accommodator 310R of the first cleaning tank 310_3, in comparison with the first cleaning tank 310 according to an embodiment as shown in FIG. 6, in the process of cleaning the first brush (refer to '211' of FIG. 2) with the solution supplied to the first solution accommodator 310R, scattering of the solution to the outside of the first cleaning tank 310_3 may be more effectively prevented.

Figure 13:
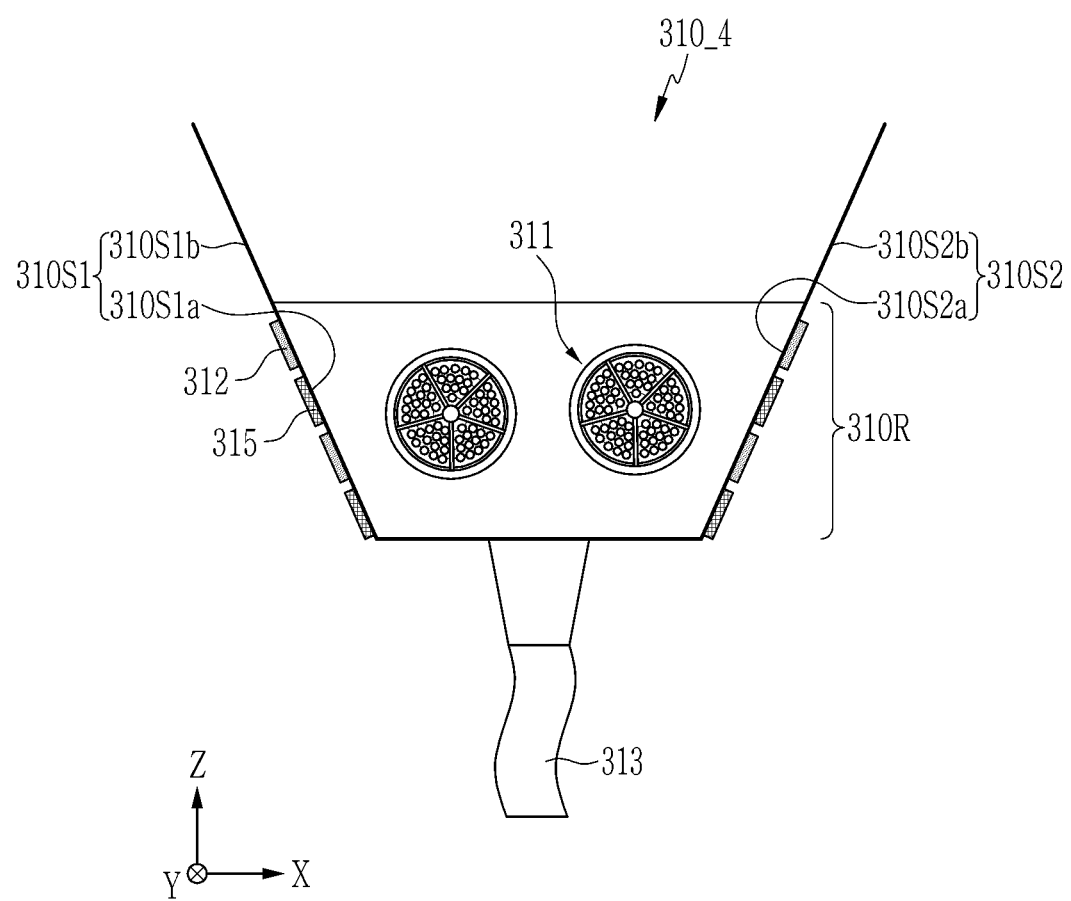
FIG. 13 is a front view schematically showing a cleaning tank of a wafer cleaning apparatus according to some embodiments.
Figure 14:
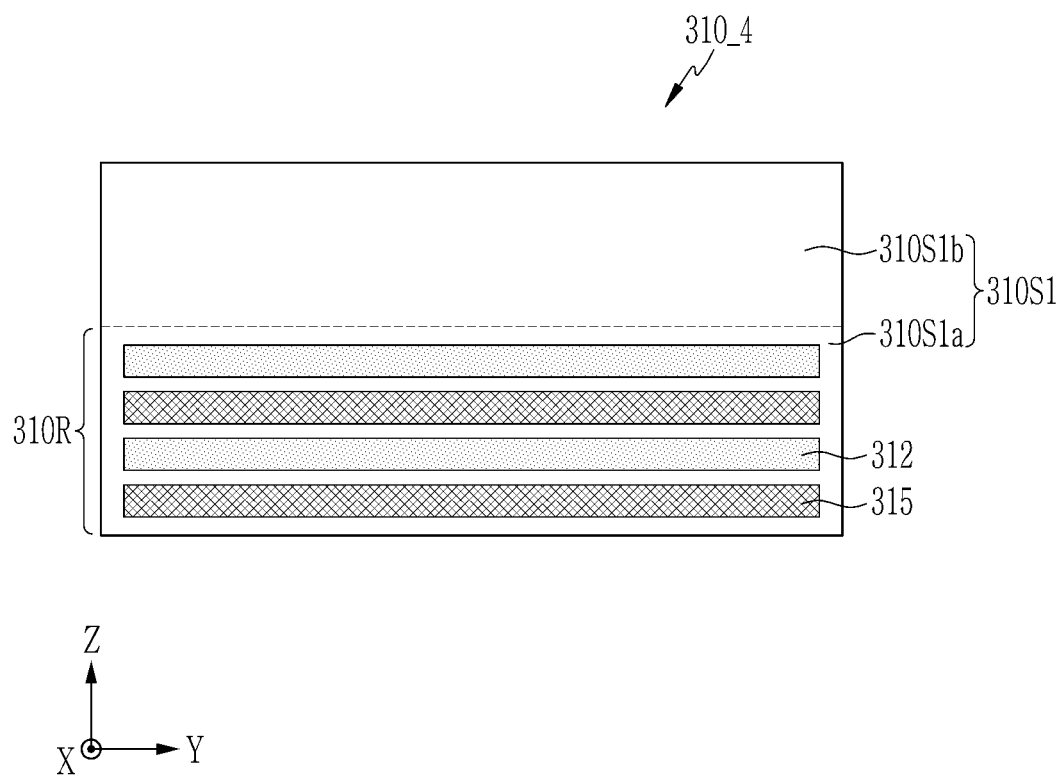
FIG. 14 is a side view of a cleaning tank of a wafer cleaning apparatus according to an embodiment shown in FIG. 13.

FIG. 13 is a front view schematically showing a cleaning tank of a wafer cleaning apparatus according to some embodiments. FIG. 14 is a side view of a cleaning tank of a wafer cleaning apparatus according to an embodiment shown in FIG. 13.

The first cleaning tank 310_4 according to an embodiment as shown in FIG. 13 and FIG. 14, unlike the first cleaning tank 310 as shown in FIG. 6, may further include an ultrasonic wave generating member 315.

For example, the ultrasonic wave generating member 315 may be disposed on each of the first side surface 310S1 and the second side surface 310S2 of the first cleaning tank 310_4 together with the first main heating member 312. The ultrasonic wave generating member 315 may be disposed on the first portion 310S1a of the first side surface 310S1 and the first portion 310S2a of the second side surface 310S2.

Each of the first main heating member 312 and the ultrasonic wave generating member 315 may extend along the second direction Y, and have a line shape. The first main heating member 312 and the ultrasonic wave generating member 315 may be alternately arranged in the third direction Z. The number of the first main heating member 312 and the number of the ultrasonic wave generating member 315 may be identical. However, it is not limited thereto, and the number and arrangement relationship of the first main heating member 312 and the ultrasonic wave generating member 315 may be variously changed.

The ultrasonic wave generating member 315 (i.e., an ultrasonic generator) may apply ultrasonic vibration to the solution supplied into the first solution accommodator 310R. For example, the ultrasonic wave generating member 315 may include a piezoelectric member (i.e., a piezoelectric vibrator) that changes electrical energy to physical vibration energy, and the ultrasonic wave generating member 315 may transfer strong vibration of a sound wave to the solution when cleaning the first brush (refer to '211' of FIG. 10).

The ultrasonic wave generating member 315 may generate ultrasonic waves having various ranges of frequencies corresponding to the size of contaminants.

Accordingly, as shown in FIG. 11, by the ultrasonic wave generating member 315, the generation of the bubble WB in the solution W provided in the first solution accommodator 310R or bursting of the bubble WB on the surface of the first brush (refer to '211' of FIG. 10) in the solution W may be accelerated, thereby improving cleaning efficiency of the first brush (refer to '211' of FIG. 10).

Figure 15:
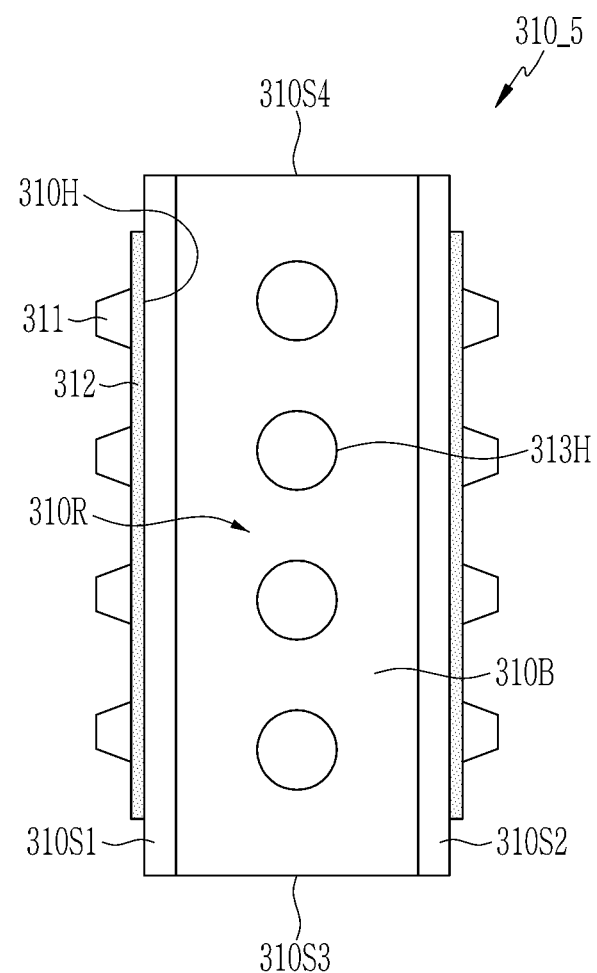
FIG. 15 is a top plan view schematically showing a cleaning tank of a wafer cleaning apparatus according to some embodiments.
Figure 16:
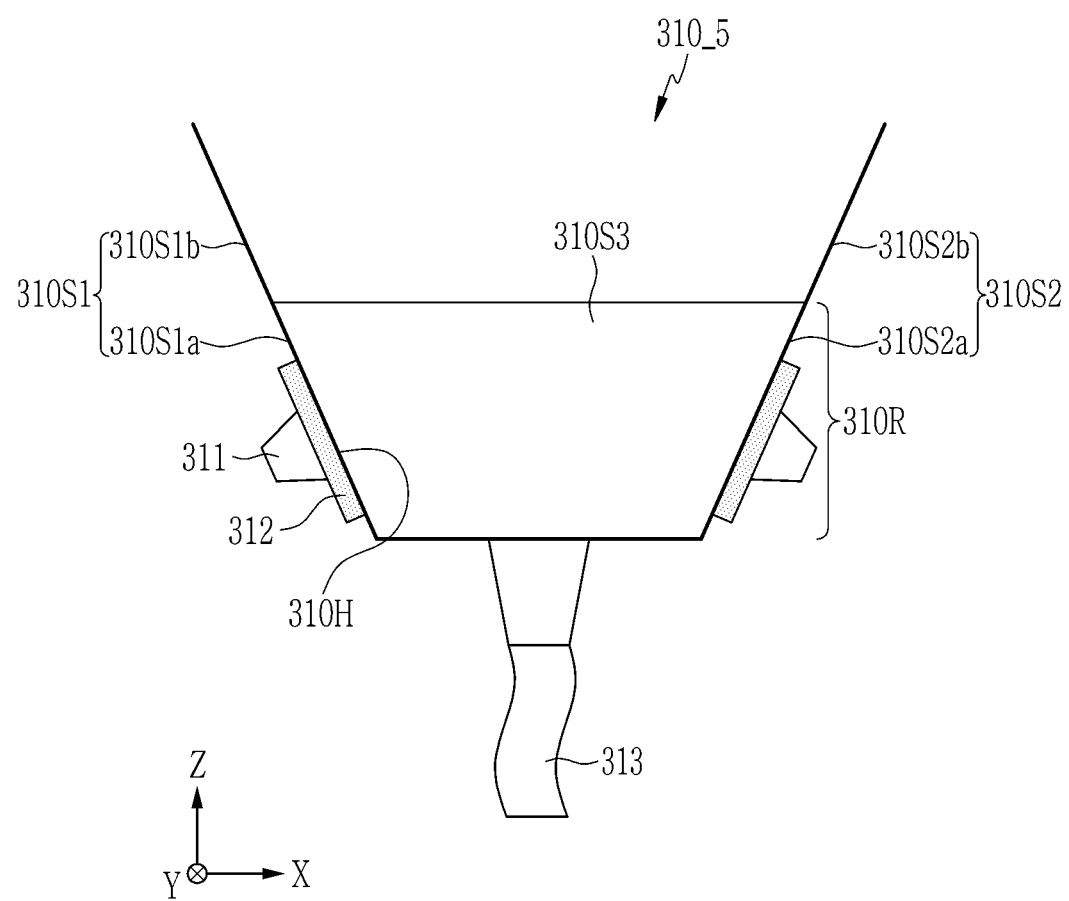
FIG. 16 is a front view schematically showing a cleaning tank of a wafer cleaning apparatus according to an embodiment shown in FIG. 15.
Figure 17:
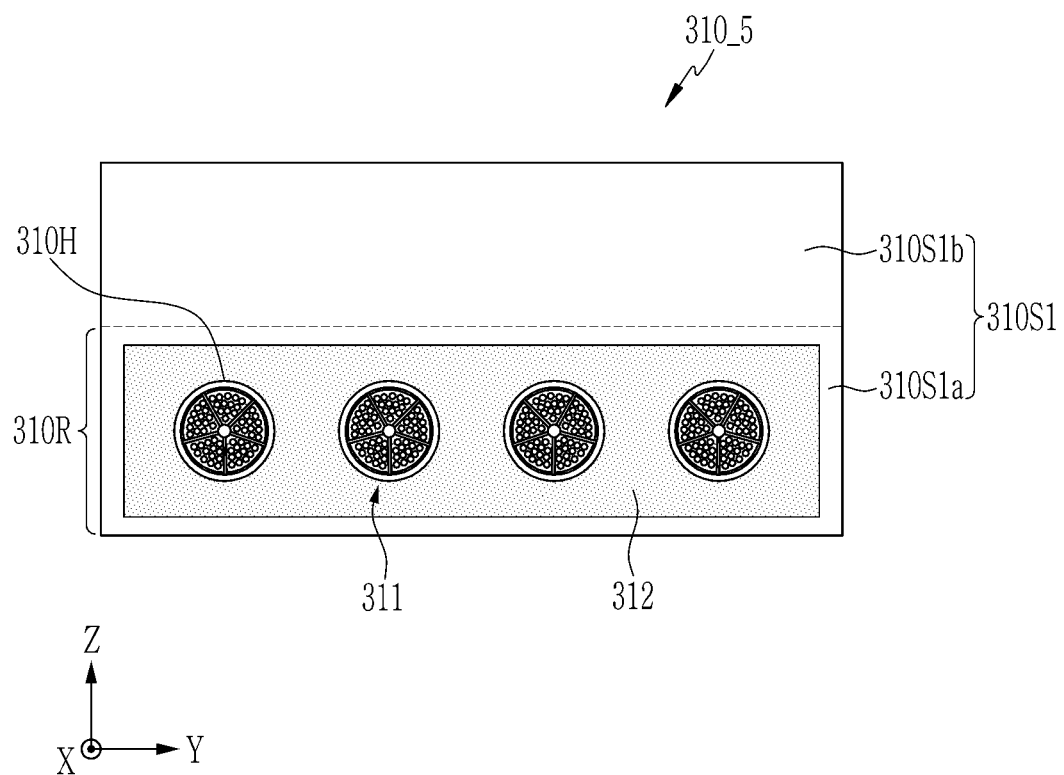
FIG. 17 is a side view schematically showing a cleaning tank of a wafer cleaning apparatus according to an embodiment shown in FIG. 15.

FIG. 15 is a top plan view schematically showing a cleaning tank of a wafer cleaning apparatus according to some embodiments. FIG. 16 is a front view schematically showing a cleaning tank of a wafer cleaning apparatus according to an embodiment shown in FIG. 15. FIG. 17 is a side view schematically showing a cleaning tank of a wafer cleaning apparatus according to an embodiment shown in FIG. 15.

The first cleaning tank 310_5 according to an embodiment as shown in FIG. 15 to FIG. 17 may have the number and arrangement of the first solution injection member 311 which is different from the first cleaning tank 310 according to an embodiment as shown in FIG. 6.

In an embodiment, the first solution injection member 311 may be disposed on each of the first side surface 310S1 and the second side surface 310S2 of the first cleaning tank 310_5. For example, the first solution injection member 311 may be disposed on the first portion 310S1a of the first side surface 310S1 and the first portion 310S2a of the second side surface 310S2.

The first cleaning tank 310_5 according to the present embodiment may include the plurality of the first solution injection members 311. The plurality of the first solution injection members 311 may be arranged side by side along the second direction Y that is the extension direction of the first side surface 310S1 and the second side surface 310S2 in each of the first portion 310S1a of the first side surface 310S1 and the first portion 310S2a of the second side surface 310S2.

In the present embodiment, the first solution injection members 311 may be disposed on the first main heating member 312 disposed above the first portion 310S1a of the first side surface 310S1 and the first portion 310S2a of the second side surface 310S2.

The first solution injection members 311 may penetrate the first main heating member 312, and may be connected to solution implant holes 310H positioned at the first portion 310S1a of the first side surface 310S1 and the first portion 310S2a of the second side surface 310S2. In an embodiment, the first main heating member 312 may contact the second side surface 310S2, and the first solution injection members 311 may penetrate the first main heating member 312 to be connected to the solution implant holes 310H, respectively. However, the number of the first solution injection members 311 and arrangement relationship thereof with respect to the first main heating member 312 are not limited thereto, and may be variously changed.

For example, the first solution injection members 311 and the first main heating member 312 may be positioned apart from each of the first portion 310S1a of the first side surface 310S1 and the first portion 310S2a of the second side surface 310S2.

In comparison with the first cleaning tank 310 according to an embodiment shown in FIG. 6, the first cleaning tank 310_5 according to the present embodiment includes a larger number of the first solution injection members 311, and therefore the time required for supplying the solution in the first solution accommodator 310R of the first cleaning tank 310_5 may be shortened. Accordingly, the efficiency of the process of cleaning the first brush ('211' of FIG. 4) may be enhanced.

Figure 18:
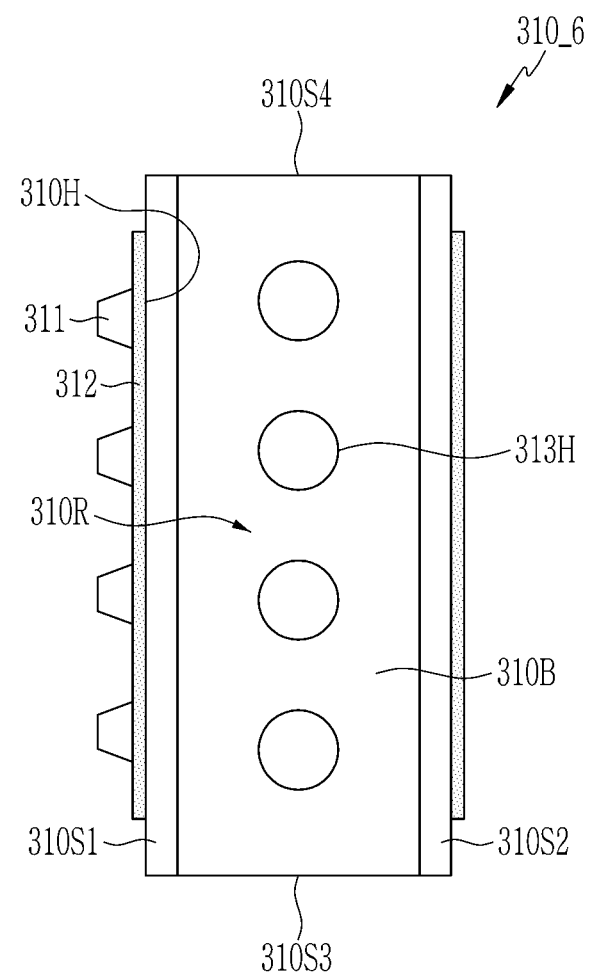
FIG. 18 is a top plan view schematically showing a cleaning tank of a wafer cleaning apparatus according to some embodiments.
Figure 19:
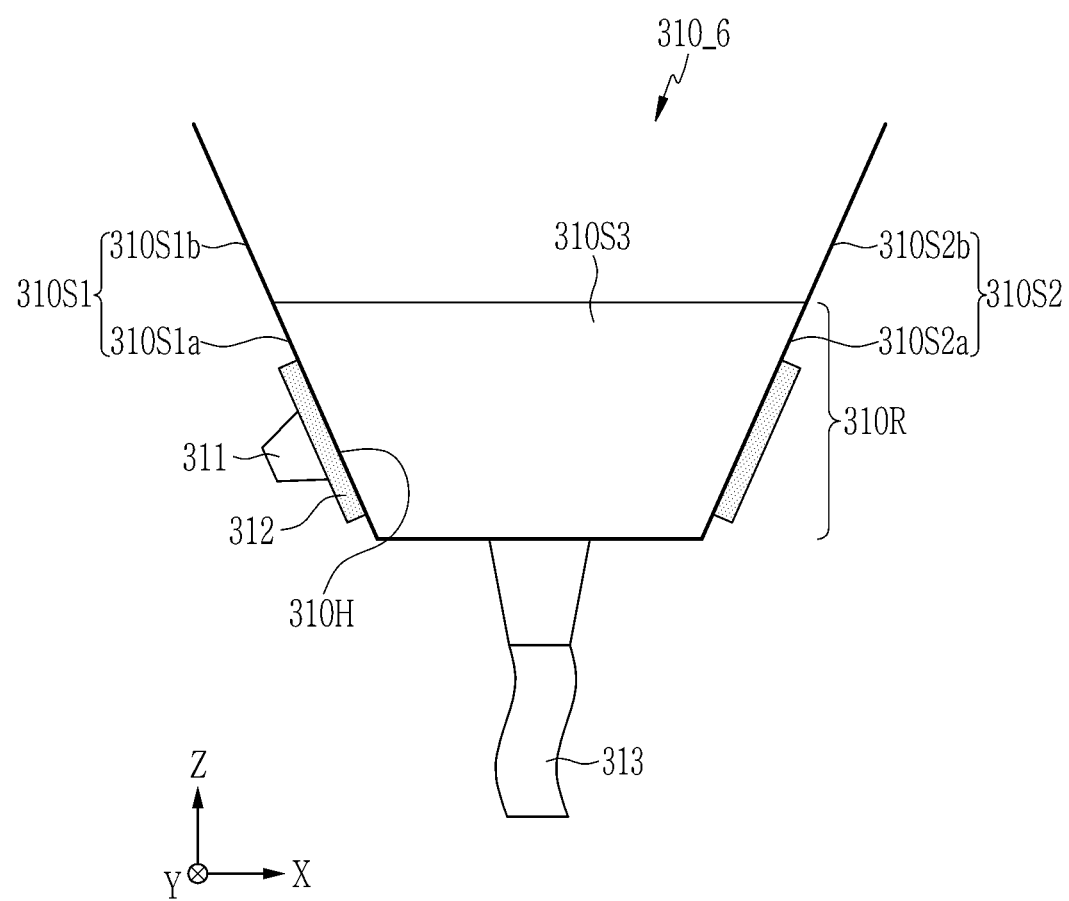
FIG. 19 is a side view schematically showing a cleaning tank of a wafer cleaning apparatus according to an embodiment shown in FIG. 18.

FIG. 18 is a top plan view schematically showing a cleaning tank of a wafer cleaning apparatus according to some embodiments. FIG. 19 is a side view schematically showing a cleaning tank of a wafer cleaning apparatus according to an embodiment shown in FIG. 18.

The first cleaning tank 310_6 according to an embodiment as shown in FIG. 18 and FIG. 19 may have the number and arrangement of the first solution injection member 311 which is different from the first cleaning tank 310_5 according to an embodiment as shown in FIGS. 15 to 17.

In an embodiment, the first solution injection member 311 may be disposed on either one of the first side surface 310S1 and the second side surface 310S2 of the first cleaning tank 310_6. For example, the first solution injection member 311 may be disposed on either one of the first portion 310S1a of the first side surface 310S1 and the first portion 310S2a of the second side surface 310S2. For example, the first solution injection member 311 may only be disposed on the first portion 310S1a of the first side surface 310S1.

The first cleaning tank 310_6 according to the present embodiment may include the plurality of the first solution injection members 311. The plurality of the first solution injection members 311 may be arranged side by side along the second direction Y that is the extension direction of the first side surface 310S1 in the first portion 310S1a of the first side surface 310S1.

In the present embodiment, the first solution injection members 311 may be disposed on the first main heating member 312 disposed above the first portion 310S1a of the first side surface 310S1. The first solution injection members 311 may penetrate the first main heating member 312, and may be connected to the solution implant holes 310H positioned on the first portion 310S1a of the first side surface 310S1. In an embodiment, the first main heating member 312 may contact the first portion 310S1a of the first side surface 310S1, and the first solution injection members 311 may penetrate the first main heating member 312 to be connected to the solution implant holes 310H, respectively.

In the present embodiment, it is illustrated that the first solution injection members 311 is positioned only on the first side surface 310S1 of the first cleaning tank 310_6, but in some embodiments, the first solution injection members 311 may only be positioned on the second side surface 310S2 of the first cleaning tank 310_6.

The first cleaning tank 310_6 according to the present embodiment may have substantially the same effect as an embodiment shown in FIG. 6. In addition, members capable of improving the cleaning efficiency other than the first solution injection member 311 may be further disposed on the third side surface 310S3 and the fourth side surface 310S4 of the first cleaning tank 310_6, and configurations for the first cleaning tank 310_6 may be diversified to improve the cleaning efficiency.

Figure 20:
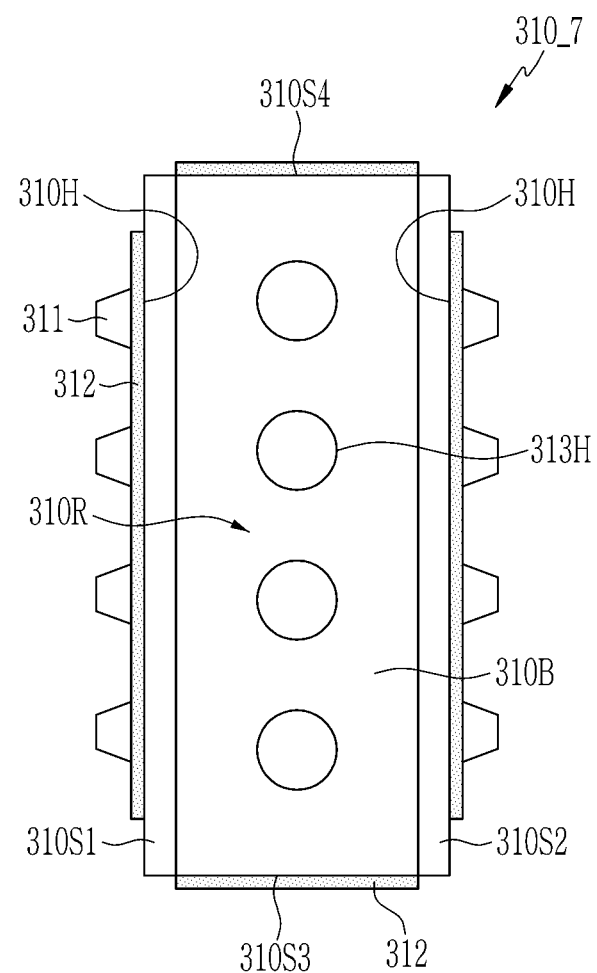
FIG. 20 and FIG. 21 is a plan views schematically showing a cleaning tank of a wafer cleaning apparatus according to some embodiments.
Figure 21:
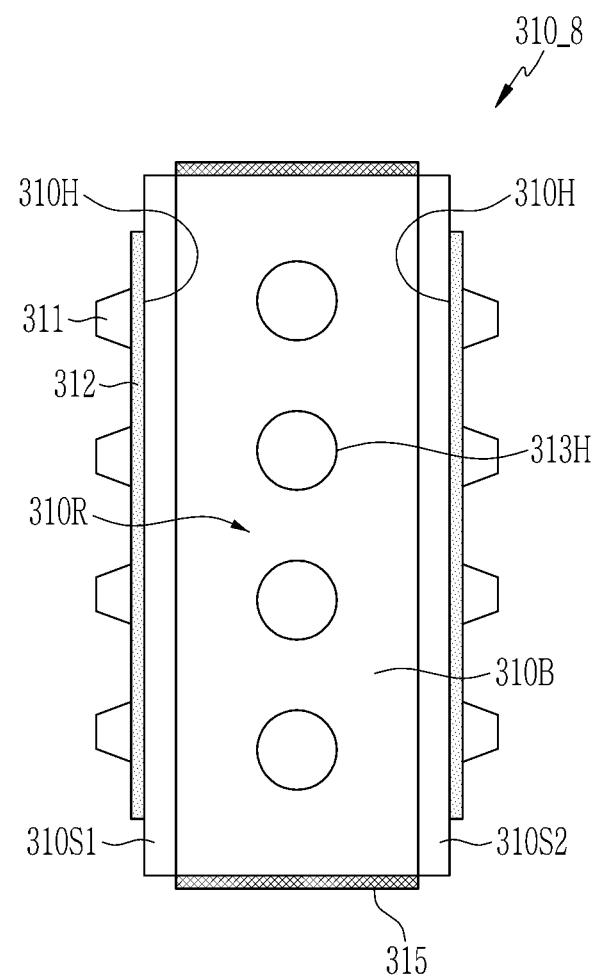

FIG. 20 and FIG. 21 is a plan views schematically showing a cleaning tank of a wafer cleaning apparatus according to some embodiments.

According to first cleaning tanks 310_7 and 310_8 according to an embodiment shown in FIG. 20 and FIG. 21, unlike the first cleaning tank 310_5 according to an embodiment shown in FIG. 15 to FIG. 17, the first main heating member 312 or the ultrasonic wave generating member 315 may be further disposed on the third side surface 310S3 and the fourth side surface 310S4.

According to an embodiment as shown in FIG. 20, the first main heating member 312 may be further disposed on each of the third side surface 310S3 and the fourth side surface 310S4 of the first cleaning tank 310_7. The first main heating member 312 disposed on each of the first side surface 310S1 and the second side surface 310S2 of the first cleaning tank 310_7 and the first main heating member 312 disposed on the third side surface 310S3 and the fourth side surface 310S4 of the first cleaning tank 310_7 may be heating members that generate heat in substantially the same way. However, it is not limited thereto, and the first main heating member 312 disposed on each of the first side surface 310S1 and the second side surface 310S2 of the first cleaning tank 310_7 and the first main heating member 312 disposed on the third side surface 310S3 and the fourth side surface 310S4 of the first cleaning tank 310_7 may be heating members that generate heat in different ways.

Although not shown in FIG. 20, the first solution injection member 311 may be disposed on each of the third side surface 310S3 and the fourth side surface 310S4 of the first cleaning tank 310_7 together with the first main heating member 312. On each of the third side surface 310S3 and the fourth side surface 310S4 of the first cleaning tank 310_7, the first solution injection member 311 may be positioned above the first main heating member 312, and may penetrate the first main heating member 312.

In the case of an embodiment according to FIG. 20, substantially the same effect as the embodiment shown in FIG. 15 to FIG. 17 may be obtained. In comparison with an embodiment shown in FIG. 15 to FIG. 17, the larger number of the first main heating members 312 are disposed, and thus the temperature increase of the solution supplied to the first solution accommodator 310R may be accelerated, and thereby cleaning efficiency of first brush (refer to '211' of FIG. 4) may be improved.

According to an embodiment shown in FIG. 21, the ultrasonic wave generating member 315 may be further disposed on each of the third side surface 310S3 and the fourth side surface 310S4 of the first cleaning tank 310_8.

In the case of an embodiment according to FIG. 21, substantially the same effect as the embodiment shown in FIG. 15 to FIG. 17 may be obtained. In comparison with an embodiment as shown in FIG. 15 to FIG. 17, the ultrasonic wave generating member 315 is further included, and thus generation of bubbles or bursting of the bubbles in the solution supplied to the first solution accommodator 310R may be accelerated, thereby improving cleaning efficiency of the first brush (refer to '211' of FIG. 4).

Figure 22:
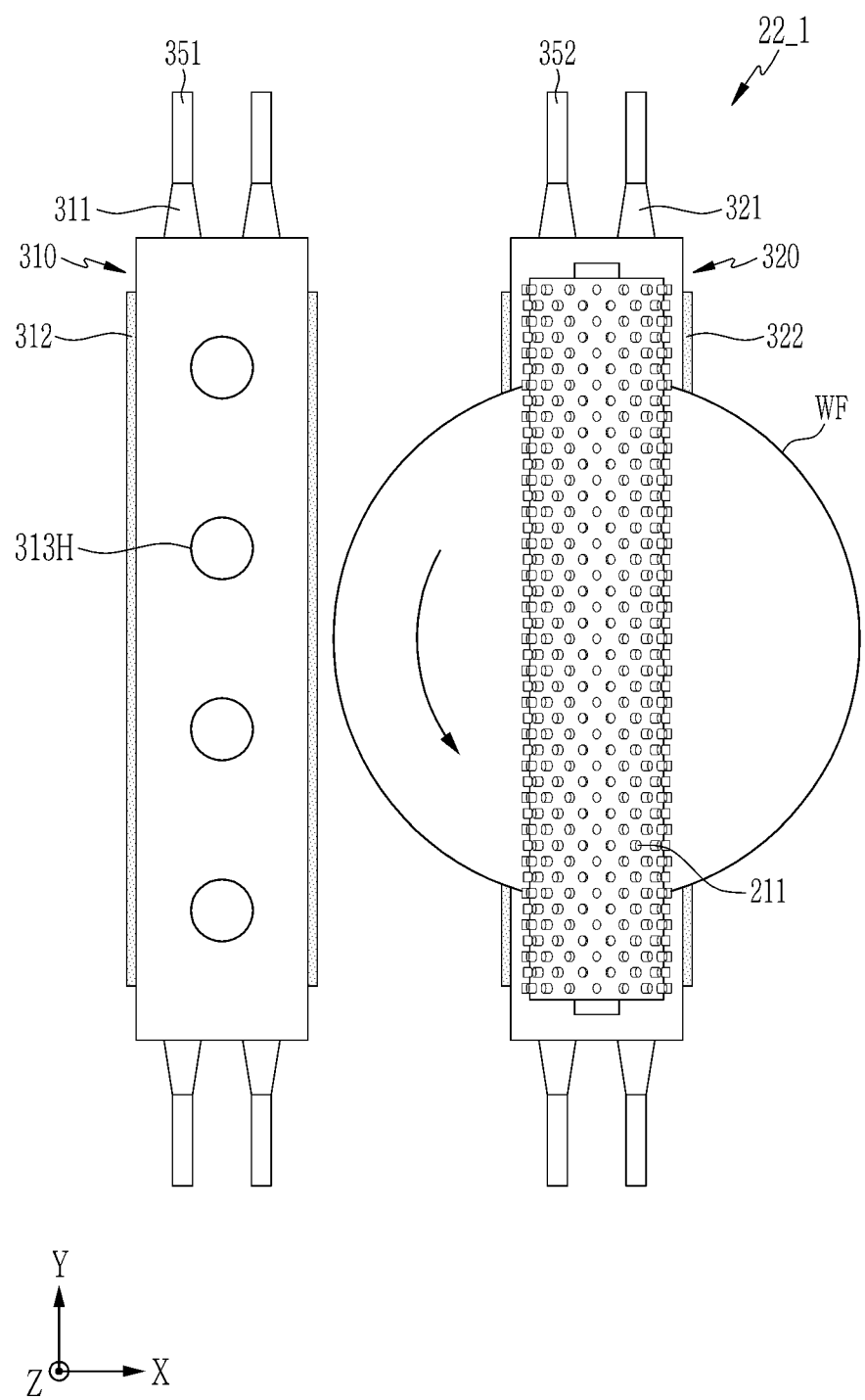
FIG. 22 is a top plan view schematically showing a portion of a wafer cleaning apparatus according to some embodiments.
Figure 23:
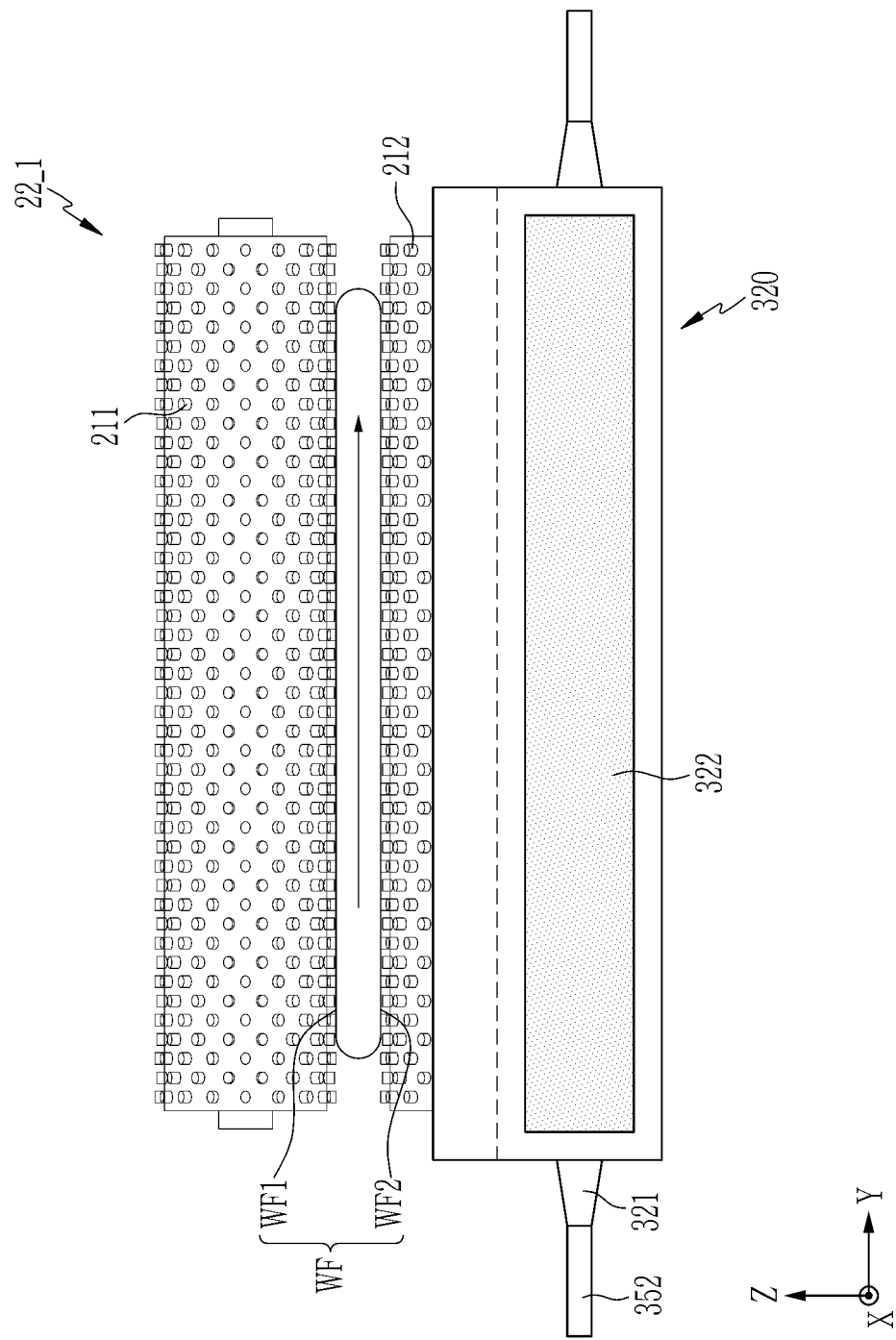
FIG. 23 is a side view schematically showing a side surface of a wafer cleaning apparatus according to an embodiment of FIG. 22.
Figure 24:
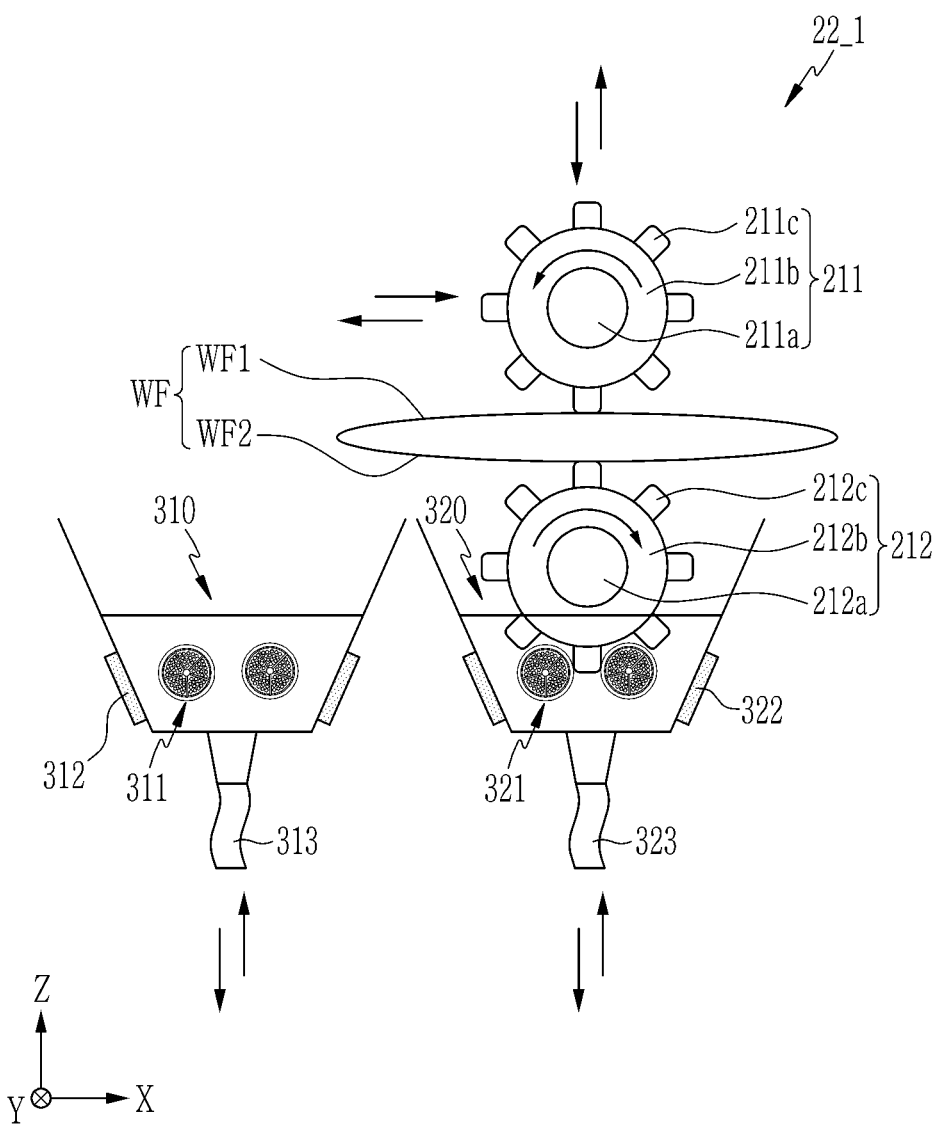
FIG. 24 is a front view schematically showing a wafer cleaning apparatus according to an embodiment of FIG. 22.
Figure 25:
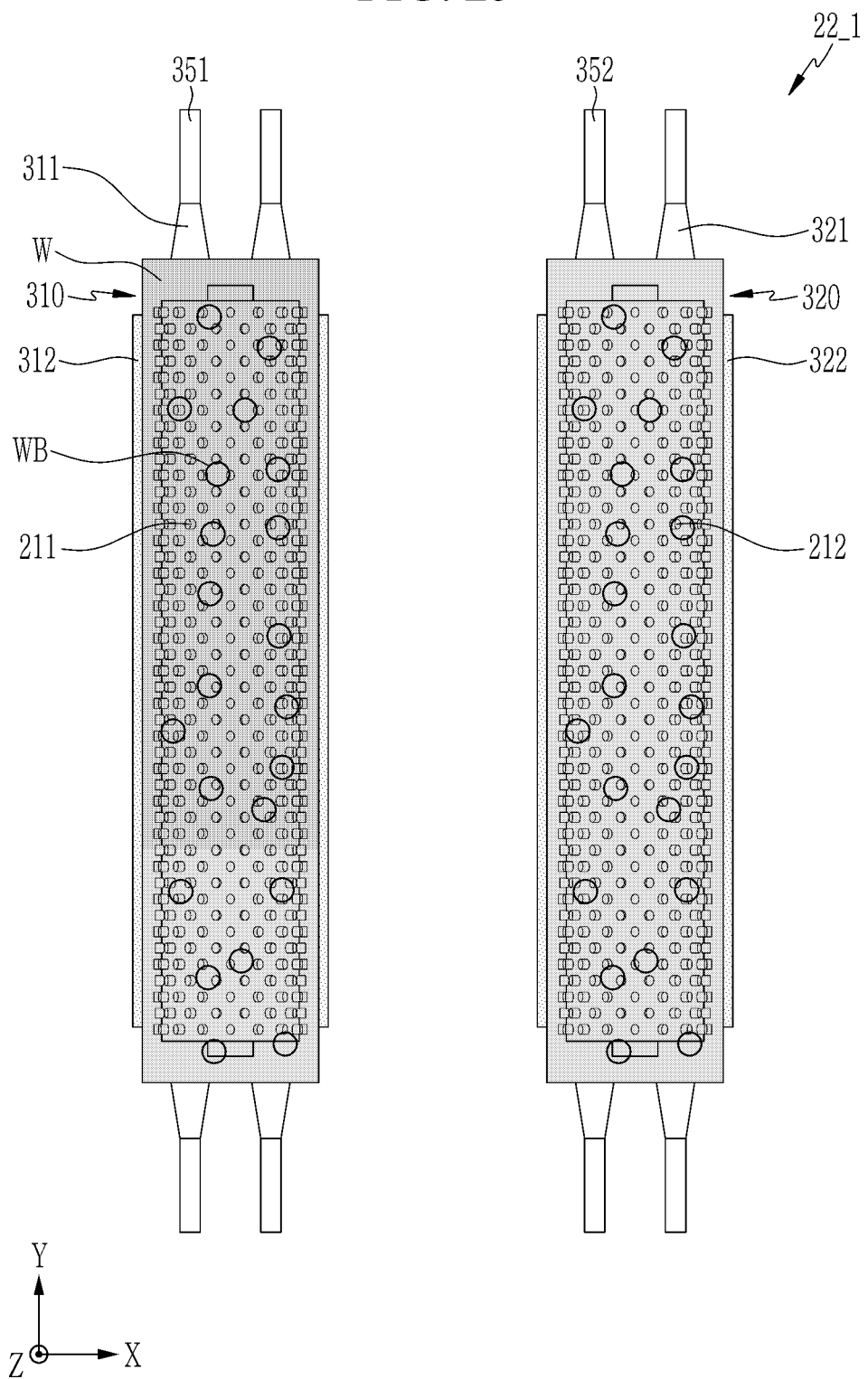
FIG. 25 is a top plan view for explaining a process of cleaning a brush of a wafer cleaning apparatus according to an embodiment of FIG. 22.
Figure 26:
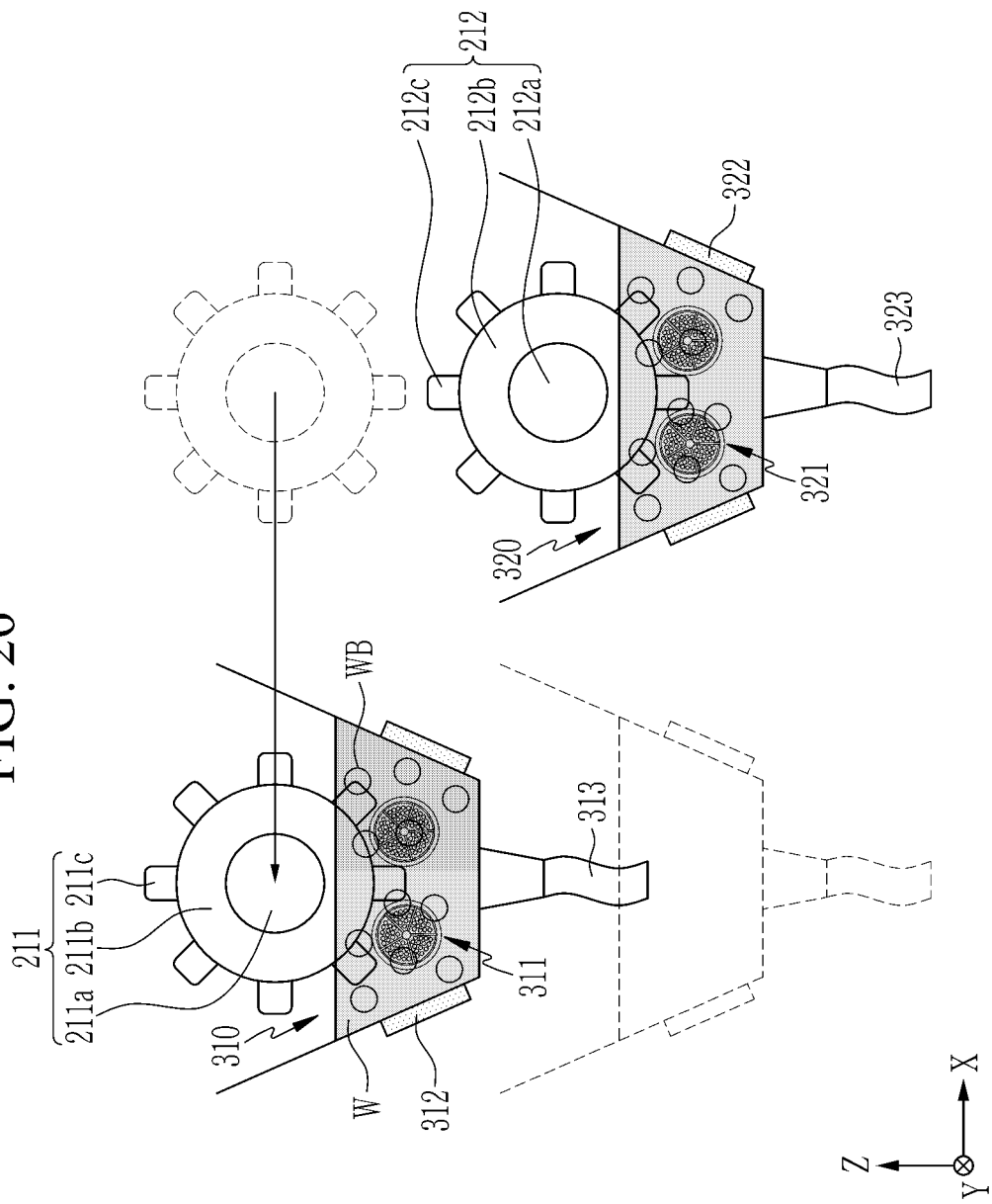
FIG. 26 is a front view for explaining a process of cleaning a brush of a wafer cleaning apparatus according to an embodiment of FIG. 22.

FIG. 22 is a top plan view schematically showing a portion of a wafer cleaning apparatus according to some embodiments. FIG. 23 is a side view schematically showing a side surface of a wafer cleaning apparatus according to an embodiment of FIG. 22. FIG. 24 is a front view schematically showing a wafer cleaning apparatus according to an embodiment of FIG. 22. FIG. 25 is a top plan view for explaining a process of cleaning a brush of a wafer cleaning apparatus according to an embodiment of FIG. 22. FIG. 26 is a front view for explaining a process of cleaning a brush of a wafer cleaning apparatus according to an embodiment of FIG. 22.

In the following embodiment, to more focus on the arrangement relationship and operation of the first and second brushes 211 and 212 and the first and second cleaning tanks 310 and 320, Illustration and description with respect to the first and second spray devices 410 and 420 and the wafer roller 500 are omitted.

According to the present embodiment, the first brush 211 and the second brush 212 may face each other in the third direction Z that is a vertical direction with respect to a floor on which the wafer cleaning apparatus 22 is installed, and the wafer WF to be cleaned may be disposed in a space between the first and second brushes 211 and 212. For example, the first brush 211 and the second brush 212 may be disposed side by side in the third direction Z, the wafer WF may be disposed in a space between the first and second brushes 211 and 212, and the first and second brushes 211 and 212 may extend in the second direction Y crossing the first direction X. The wafer WF may rotate around a normal direction of the first surface WF1 or a normal direction of the second surface WF2, and the normal direction is parallel to the third direction Z.

Accordingly, the first brush 211 may face the first surface WF1 positioned on the first side of the wafer WF in the third direction Z, and the second brush 212 may face the second surface WF2 that is an opposite surface of the first surface WF1 positioned on the second side in the third direction Z. Here, the first surface WF1 of the wafer WF may correspond to an upper surface of the wafer WF in the third direction Z, and the second surface WF2 may correspond to a bottom surface of the wafer WF in the third direction Z.

The wafer WF may extend in a plane defined by the first and second directions X and Y between the first brush 211 and the second brush 212. For example, the first surface WF1 and the second surface WF2 of the wafer WF may face the first brush 211 and the second brush 212 in the third direction Z, respectively.

The wafer WF may be rotated on a plane extending along the first direction X and the second direction Y. The wafer WF may rotate around an axis perpendicular to the first direction X that is an alignment direction of the first cleaning tank 310 and the second cleaning tank 320. For example, the wafer WF may rotate counterclockwise when viewed in a plane view, and each of a front surface of the first surface WF1 and a front surface of the second surface WF2 may contact the first brush 211 and the second brush 212.

The first cleaning tank 310 and the second cleaning tank 320 may be disposed side by side along the first direction X that is a horizontal direction with respect to the floor on which the wafer cleaning apparatus 22 is installed. The first cleaning tank 310 may not overlap the first and second brushes 211 and 212 and the wafer WF in the third direction Z, and the second cleaning tank 320 may overlap the first and second brushes 211 and 212 and the wafer WF in the third direction Z. For example, the second brush 212, the wafer WF, and the first brush 211 may be sequentially positioned above the second cleaning tank 320 along the third direction Z.

At least a portion of the second brush 212 may be positioned within the second cleaning tank 320. For example, at least a portion of the second brush 212 may be accommodated within the second cleaning tank 320, and at least a portion of the second brush 212 may overlap the second cleaning tank 320 in the first direction X and the second direction Y.

Unlike the wafer cleaning apparatus 22 according to an embodiment of FIG. 4, in a wafer cleaning apparatus 22_1 according to the present embodiment, the cleaning of the wafer WF may be performed while at least a portion of the second brush 212 is accommodated in in the second cleaning tank 320.

Accordingly, in some embodiments, in the cleaning step of cleaning the wafer WF by the first and second brushes 211 and 212, the cleaning of the second brush 212 accommodated in the second cleaning tank 320 may be simultaneously performed with the cleaning of the wafer WF. However, it is not limited thereto, and the cleaning step of cleaning the second brush 212 may be simultaneously performed with the cleaning of the first brush 211 after the first brush 211 moves and is accommodated in the first cleaning tank 310.

As shown in FIG. 25 and FIG. 26, after the first brush 211 and the second brush 212 finish the cleaning of the wafer WF, when the wafer WF is removed from between the first brush 211 and the second brush 212, the brush controller (refer to '250' of FIG. 2) may control the first brush 211 to move in the first direction X and to be accommodated in the first cleaning tank 310.

After the first brush 211 and the second brush 212 finish the cleaning of the wafer WF, when the wafer WF is removed from between the first brush 211 and the second brush 212, the cleaning tank controller (refer to '340' of FIG. 2) may control the first cleaning tank 310 to move in the third direction Z that is a vertical direction with respect to the floor on which the wafer cleaning apparatus 22_1 is installed and to accommodate at least a portion of the first brush 211.

While the first brush 211 and the first cleaning tank 310 move in the first direction X and the third direction Z, the second brush 212 and the second cleaning tank 320 may be fixed. However, it is not limited thereto, and in some embodiments, while the first brush 211 and the first cleaning tank 310 are moved, the second brush 212 and the second cleaning tank 320 may also be moved.

Accordingly, the first cleaning tank 310 and the second cleaning tank 320 may accommodate the first brush 211 and the second brush 212 at different levels. For example, the first cleaning tank 310 may move in the third direction Z that is a vertical direction with respect to the floor on which the wafer cleaning apparatus 22_1 is installed and may accommodate the first brush 211. The first cleaning tank 310 may be positioned at a level higher than the second cleaning tank 320.

Thereafter, the solution for cleaning the first and second brushes 211 and 212 is supplied to the first and second cleaning tanks 310 and 320, and the first and second brushes 211 and 212 are cleaned, which is substantially the same as have been described with reference to FIG. 9 and FIG. 10. The repeated description thereof will be omitted.

While the embodiment of the present disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A wafer cleaning apparatus comprising:
 a wafer roller configured to rotate a wafer around a first direction, wherein the wafer includes a first surface and a second surface that is an opposite surface of the first surface, and the first direction is parallel to a normal direction of the first surface of the wafer;
 a first brush facing the first surface of the wafer;
 a second brush facing the second surface of the wafer, wherein the second brush is spaced apart from the first brush in the first direction, and the first and second surfaces of the wafer are disposed in a space between the first and second brushes;

a first cleaning tank disposed apart from the first brush and movable to accommodate at least a portion of the first brush; and a second cleaning tank disposed apart from the second brush and movable to accommodate at least a portion of the second brush, wherein the first cleaning tank and the second cleaning tank include a first solution injection member connected to a first solution supply pipe and a second solution injection member connected to a second solution supply pipe, respectively, and wherein each of the first and second solution injection members includes a bubble generating filter having a plurality of through-holes.

2. The wafer cleaning apparatus of claim 1, wherein each of the first cleaning tank and the second cleaning tank comprises:
a bottom surface;
a first side surface and a second side surface connected to the bottom surface and extending in a same direction as each of the first brush and the second brush, and facing each other;
a third side surface and a fourth side surface connected to the bottom surface and crossing each of the first side surface and the second side surface, and facing each other; and
a solution accommodator defined by the bottom surface, the first side surface, the second side surface, the third side surface, and the fourth side surface.

3. The wafer cleaning apparatus of claim 2, further comprising:
a first main heating member disposed on each of the first side surface and the second side surface of the first cleaning tank, wherein the first solution injection member is disposed on each of the third side surface and the fourth side surface of the first cleaning tank; and
a second main heating member disposed on each of the first side surface and the second side surface of the second cleaning tank, wherein the second solution injection member is disposed on each of the third side surface and the fourth side surface of the second cleaning tank.

4. The wafer cleaning apparatus of claim 3, wherein each of the first and second solution injection members further comprises:
a first sub-heating member surrounding a side surface of the bubble generating filter; and
a plurality of second sub-heating members radially extending from a central portion of the bubble generating filter toward the side surface of the bubble generating filter, and
wherein the plurality of through-holes are disposed in spaces between two adjacent second sub-heating members of the plurality of second sub-heating members.

5. The wafer cleaning apparatus of claim 4, wherein each of the first main heating member, the second main heating member, the first sub-heating member, and the plurality of second sub-heating members is a heating element that generates heat by using electric joule heating or a Peltier element.

6. The wafer cleaning apparatus of claim 3, further comprising:
a first ultrasonic wave generating member disposed on each of the first side surface and the second side surface of the first cleaning tank; and a second ultrasonic wave generating member disposed on each of the first side surface and the second side surface of the second cleaning tank.

7. The wafer cleaning apparatus of claim 6, wherein:
the first main heating member and the first ultrasonic wave generating member extend in a same direction as the first side surface and the second side surface of the first cleaning tank,
the first main heating member and the first ultrasonic wave generating member are spaced apart from each other along a vertical direction with respect to a floor on which the wafer cleaning apparatus is installed,
the second main heating member and the second ultrasonic wave generating member extend in a same direction as the first side surface and the second surface of the second cleaning tank, and
the second main heating member and the second ultrasonic wave generating member are spaced apart from each other along the vertical direction with respect to the floor on which the wafer cleaning apparatus is installed.

8. The wafer cleaning apparatus of claim 6, further comprising:
a first solution supply member;
a first bubble generation member connecting the first solution supply member to the first solution supply pipe;
a second solution supply member; and
a second bubble generation member connecting the second solution supply member to the second solution supply pipe.

9. The wafer cleaning apparatus of claim 8, further comprising:
a plurality of solution discharging holes disposed at the bottom surface of each of the first and second cleaning tanks.

10. The wafer cleaning apparatus of claim 2, wherein in each of the first and second cleaning tanks, an end portion of the first side surface and an end portion of the second side surface are positioned higher than an end portion of the third side surface and an end portion of the fourth side surface.

11. The wafer cleaning apparatus of claim 10, wherein in each of the first and second cleaning tanks, an angle formed by the first side surface and the bottom surface and an angle formed by the second side surface and the bottom surface are 120 degrees or more.

12. The wafer cleaning apparatus of claim 2, further comprising:
a first main heating member contacting each of the first side surface and the second side surface of the first cleaning tank,
wherein the first solution injection member penetrates the first main heating member to be connected to the solution accommodator of the first cleaning tank; and
a second main heating member contacting each of the first side surface and the second side surface of the second cleaning tank, wherein the second solution injection member penetrates the second main heating member to be connected to the solution accommodator of the second cleaning tank.

13. The wafer cleaning apparatus of claim 12, further comprising:
a first ultrasonic wave generating member disposed on each of the third side surface and the fourth side surface of the first cleaning tank; and a second ultrasonic wave generating member disposed on each of the third side surface and the fourth side surface of the second cleaning tank.

14. The wafer cleaning apparatus of claim 1,
wherein each of the first brush and the second brush comprises:
a brush rotation shaft;
a brush member surrounding the brush rotation shaft; and
a plurality of protrusion portions disposed on a surface of the brush member,
wherein a maximum distance between end points of two opposite protrusion portions of the plurality of protrusion portions is greater than a depth of a solution accommodator, and
wherein the two opposite protrusion portions are arranged along a straight line extending through a rotation axis of the brush rotation shaft.

15. A wafer cleaning apparatus comprising:
a wafer roller configured to rotate a wafer around a first direction, wherein the wafer includes a first surface and a second surface that is an opposite surface of the first surface, and the first direction is parallel to a normal direction of the first surface of the wafer;
a first brush and a second brush disposed side by side in a horizontal direction with respect to a floor on which the wafer cleaning apparatus is installed, wherein the horizontal direction is parallel to the first direction, wherein the first surface and the second surface of the wafer are disposed between the first and second brushes, and wherein the first and second surfaces of the wafer face the first and second brushes, respectively;
a first cleaning tank disposed below the first brush, and movable to accommodate at least a portion of the first brush; and
a second cleaning tank disposed below the second brush, and movable to accommodate at least a portion of the second brush,
wherein each of the first cleaning tank and the second cleaning tank comprises:
a first side surface and a second side surface extending in a same direction as an extension direction of each of the first cleaning tank and the second cleaning tank;
a third side surface and a fourth side surface crossing each of the first side surface and the second side surface;
at least one solution injection member disposed on at least one of the first side surface, the second side surface, the third side surface, and the fourth side surface, wherein each of the at least one solution injection member includes a bubble generating filter having a plurality of through-holes;
a first main heating member contacting the first side surface; and
a second main heating member contacting the second side surface.

16. The wafer cleaning apparatus of claim 15,
wherein the at least one solution injection member comprises:
a first plurality of solution injection members disposed on the first side surface, and arranged along the extension direction of the first cleaning tank and the second cleaning tank, and
wherein each of the first plurality of solution injection members penetrates the first main heating member.

17. The wafer cleaning apparatus of claim 16,
wherein the at least one solution injection member further comprises:
a second plurality of solution injection members disposed on the second side surface, and arranged along the extension direction of the first cleaning tank and the second cleaning tank, and
wherein each of the second plurality of solution injection members penetrates the second main heating member.

18. The wafer cleaning apparatus of claim 17, further comprising:
a first scattering prevention member between the first side surface and the first main heating member; and
a second scattering prevention member between the second side surface and the second main heating member,
wherein the first and second scattering prevention members extend along the first and second side surfaces, respectively,
wherein an end point of the first scattering prevention member is positioned higher than an end point of the first side surface, and
wherein an end point of the second scattering prevention member is positioned higher than an end point of the second side surface.

19. The wafer cleaning apparatus of claim 15,
wherein each of the at least one solution injection member further comprises:
a first sub-heating member surrounding a side surface of the bubble generating filter;
a plurality of second sub-heating members radially extending from a central portion of the bubble generating filter toward the side surface of the bubble generating filter; and
a plurality of through-holes disposed in spaces between two adjacent second sub-heating members of the plurality of second sub-heating members.

20. A wafer cleaning apparatus comprising:
a wafer roller configured to rotate a wafer around a first direction, wherein the wafer includes a first surface and a second surface that is an opposite surface of the first surface, and the first direction is parallel to a normal direction of the first surface of the wafer;
a first brush facing the first surface of the wafer;
a second brush facing the second surface of the wafer, and disposed under the first brush in a vertical direction with respect to a floor on which the wafer cleaning apparatus is installed, wherein the vertical direction is parallel to the first direction;
a first cleaning tank disposed below the second brush in the vertical direction, and accommodating at least a portion of the second brush; and
a second cleaning tank disposed side by side to the first cleaning tank in a horizontal direction with respect to the floor, and movable to accommodate at least a portion of the first brush,
wherein each of the first cleaning tank and the second cleaning tank comprises:
a main heating member disposed on a first side surface of the first cleaning tank and a first side surface of the second cleaning tank; and
a solution injection member disposed on a second side surface of the first cleaning tank and a second side surface of the second cleaning tank, and
wherein the solution injection member comprises:
a bubble generating filter having a plurality of through-holes;

a first sub-heating member surrounding a side surface of the bubble generating filter; and a second sub-heating member extending from a central portion of the bubble generating filter toward the side surface of the bubble generating filter.

\* \* \* \* \*